US010023747B2

(12) United States Patent
Tielemans et al.

(10) Patent No.: US 10,023,747 B2
(45) Date of Patent: Jul. 17, 2018

(54) ACTIVE ENERGY RAY CURABLE AQUEOUS EMULSIONS

(71) Applicant: Allnex Belgium S.A., Drogenbos (BE)

(72) Inventors: Michel Tielemans, Wemmel (BE); Jean-Noel Baurant, Dilbeek (BE); Luc Lindekens, Merchtem (BE); Stephan Peeters, Heverlee (BE)

(73) Assignee: ALLNEX BELGIUM S.A., Drogenbos (BE)

( * ) Notice: Subject to any disclaimer, the term of this patent is extended or adjusted under 35 U.S.C. 154(b) by 0 days.

(21) Appl. No.: 14/371,287

(22) PCT Filed: Mar. 11, 2013

(86) PCT No.: PCT/EP2013/054859
§ 371 (c)(1),
(2) Date: Jul. 9, 2014

(87) PCT Pub. No.: WO2013/135621
PCT Pub. Date: Sep. 19, 2013

(65) Prior Publication Data
US 2014/0377466 A1 Dec. 25, 2014

(30) Foreign Application Priority Data

Mar. 13, 2012 (EP) ..................... 12159266

(51) Int. Cl.
*C09D 5/02* (2006.01)
*C09D 4/06* (2006.01)
*C09J 4/06* (2006.01)
*C09D 133/14* (2006.01)
*C09D 11/101* (2014.01)
*B05D 3/00* (2006.01)
*B05D 3/06* (2006.01)
*C09D 7/65* (2018.01)
*C08L 63/10* (2006.01)
*G03F 7/027* (2006.01)

(52) U.S. Cl.
CPC ............ *C09D 5/022* (2013.01); *B05D 3/007* (2013.01); *B05D 3/067* (2013.01); *C09D 5/027* (2013.01); *C09D 7/65* (2018.01); *C09D 11/101* (2013.01); *C09D 133/14* (2013.01); *C08L 63/10* (2013.01); *C08L 2201/54* (2013.01); *C08L 2312/06* (2013.01); *G03F 7/027* (2013.01)

(58) Field of Classification Search
None
See application file for complete search history.

(56) References Cited

U.S. PATENT DOCUMENTS

| 5,548,005 | A | * | 8/1996 | Kurth et al. .................. 523/414 |
| 2003/0147835 | A1 | * | 8/2003 | Munro et al. .............. 424/70.16 |
| 2005/0287302 | A1 | | 12/2005 | Awad et al. |
| 2008/0039593 | A1 | | 2/2008 | Glockner et al. |
| 2011/0052903 | A1 | | 3/2011 | Van Oorschot et al. |
| 2012/0308729 | A1 | | 12/2012 | Fischer et al. |

FOREIGN PATENT DOCUMENTS

| DE | 43 43 885 | 6/1995 |
| DE | 10 2005 002 388 | 7/2006 |
| EP | 2 325 221 | 5/2011 |
| JP | S61-241308 | 10/1986 |
| JP | 2005-247884 | 9/2005 |
| JP | 2007-191530 | 8/2007 |
| JP | 2009-114040 | 5/2009 |
| WO | WO2004/037935 | 5/2004 |

OTHER PUBLICATIONS

Chen et al. (Journal of Applied Polymer Science, 45(3), Mar. 10, 2003, 487-499).*
Sigma-Aldrich Product No. 542342.*
Machine translation of JP 2007-191530 A.*
Machine translation of JP 2005-247884 A.*
International Search Report issued Aug. 21, 2013 in International (PCT) Application No. PCT/EP2013/054859.
R. Schwalm, "Basics, Recent Developments and New Applications", Elsevier, pp. 45-48, 2007.
P. Glockner, "Coatings and Printing Inks", Vincent$_3$ Network, pp. 118-120, 2008.
J. James et al., "A Cross-Linkable Dendritic Emulsifier for Water-Borne UV Systems", Surface Coatings International Part A, vol. 4, pp. 211-213, 2006.
M. Tielemans et al., "Water-Based Radiation Curable Oligomers Open New Horizons for Hardcoats", pp. 1-13, 2012.

* cited by examiner

*Primary Examiner* — Vu A Nguyen
(74) *Attorney, Agent, or Firm* — Wenderoth, Lind & Ponack, L.L.P.

(57) ABSTRACT

The present invention relates to an aqueous radiation curable composition comprising: (I) at least one ethylenically unsaturated compound (A), and (II) at least one emulsifier (B) comprising alternating polyalkylene oxide segments, wherein said emulsifier optionally bears one or more groups selected from alkyl groups, aryl groups hydroxyl groups and/or ethylenically unsaturated groups, and wherein said emulsifier (B) has an HLB value of at least 4.5, preferably at least 7. The compositions of the invention are particularly suited for the manufacture of sprayable eco-friendly hardcoats, but they are also suitable for the making of inks, overprint varnishes and adhesives, alone or in combination with e.g. a water-borne polymer dispersion.

20 Claims, No Drawings

ACTIVE ENERGY RAY CURABLE AQUEOUS EMULSIONS

The present invention relates to aqueous compositions that comprise emulsifiers and water-insoluble ethylenically unsaturated compounds, to their use and preparation.

Plastics coatings represent a significant and high growth segment of the coating industry and target the challenging requests for advanced surface finish technologies covering aesthetics as well as additional protective & functional features. The radiation curing technology has been used successfully in this industry for over 30 years and is especially renowned for superior hardcoat properties. Highly functional urethane acrylates and polyester acrylates are particularly suitable for the purpose of making hardcoats showing a high crosslinking density and resulting in a very hard but tough crosslinked network.

Due to the high viscosity of the multi-functional urethane acrylates and polyester acrylates, other (meth)acrylate monomers with a lower functionality can be used to reduce the formulation viscosity, but such addition significantly lowers the hardcoat performance after curing. Another alternative consists in the dilution of the hardcoat composition with a solvent (up to 50%) allowing a suitable viscosity for spray application. In this case, the product suffers however from a high level of VOC which constitutes a severe concern for health, environment and occupational safety.

Low-viscous waterborne alternatives, like radiation-curable polyurethane dispersions (UV-PUDs), have been used a lot in the modern industry. However, despite the fact that unsaturated polymer dispersions present a very high functionality, the total amount of (meth)acrylic unsaturations (expressed as meq/g) is quite low. This is a downside for hardcoat applications where a dense crosslinking density is desirable for both hardness and resistance.

There is a demand for high performing hardcoats with a minimum environmental impact (low VOC) and a low viscosity for applications by spray. There is in particular an interest for aqueous compositions based on smaller molecules with advantageously both a high functionality and a high level of ethylenic unsaturation (meq/g), capable to provide a high crosslinking density after cure.

DE4343885 discloses aqueous radiation curable dispersions wherein an acrylated emulsifier is used that is derived from polyoxyalkylene amines. The emulsifier used is therein is prepared by reacting (B0) a di- or polyepoxy component with (B1) a primary or secondary monoamine of a polyethylene(propylene glycol) monoether and/or by reacting compounds (B0) with (B2) a di- or polyisocyanate, followed by reaction with a polyethylene(propylene glycol) monoether and then acrylic or methacrylic acid. Polybloc structures made based on this kind of linking molecules do not give the best stabilization since the tensio-active character of the molecule and its ability to cover and stabilize polymeric surfaces in water is reduced by the partial loss of the amphiphilic character of the molecule.

Only (meth)acrylated emulsifiers are described in DE4343885.

There is a further need for emulsifiers that can be used both in (meth)acrylated and non-(meth)acrylated form, depending on the end use, and providing the suitable stabilization of the polyacrylate emulsion at high solid content with the lowest detrimental impact on the hardcoat properties.

Against this background we now provide an aqueous radiation curable composition comprising:

(I) at least one ethylenically unsaturated compound (A), and (II) at least one emulsifier (B) comprising alternating polyalkylene oxide segments, wherein said emulsifier optionally bears one or more groups selected from alkyl groups, aryl groups, hydroxyl groups and/or copolymerizable ethylenically unsaturated groups, and wherein said emulsifier (B) has an HLB value of at least 4.5.

Typically however emulsifiers (B) of the invention are comprised of (or essentially consist of) alternating polyalkylene oxide segments, with the proviso that compounds (B) can optionally bear one or more groups selected from alkyl groups, aryl groups, hydroxyl groups and/or copolymerizable ethylenically unsaturated groups as defined above.

By "alternating" is meant to designate in the present invention that there are typically blocs of at least 2 different polyalkylene oxide segments. The alternating polyalkylene oxide segments are typically alternating polyethylene oxide segments and polypropylene oxide segments. Di-bloc and/or tri-bloc emulsifiers are generally preferred. The emulsifier (B) advantageously is a non-ionic emulsifier.

In particular, there is provided herein an aqueous radiation curable composition comprising:

(I) at least one ethylenically unsaturated compound (A), and (II) at least one emulsifier (B) comprising alternating polyethylene oxide segments and polypropylene oxide segments, wherein said emulsifier optionally bears one or more groups selected from alkyl groups, aryl groups, hydroxyl groups and/or copolymerizable ethylenically unsaturated groups, and wherein said emulsifier (B) has an HLB value of at least 4.5.

Even more in particular there is provided herein an aqueous radiation curable composition comprised of (or consisting essentially of): (I) at least one ethylenically unsaturated compound (A), and (II) at least one emulsifier (B) comprising alternating polyethylene oxide segments and polypropylene oxide segments, wherein said emulsifier optionally bears one or more groups selected from alkyl groups, aryl groups, hydroxyl groups and/or copolymerizable ethylenically unsaturated groups, and wherein said emulsifier (B) has an HLB value of at least 4.5.

In an embodiment of the invention, emulsifiers (B) are represented by the general formula (I):

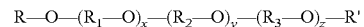

wherein
each of R1, R2 or R3 independently is a linear or branched C2-C12 alkyl;
R1≠R2 and R3≠R2;
X=6-100;
Y=6-100;
Z=0-100;
R and R' each independently are selected from the following: alkyl groups (typically linear or branched C1-C18 alkyl), aryl groups (typically linear or branched C6-C24 aryl), (meth)acryloyl groups or —H.

In one embodiment of the invention, R3=R1. In another embodiment of the invention, R3≠R1. Typically R1, R2 and R3 are selected from -ethyl and -propyl. Preferred are emulsifiers of the type EO-PO and/or of the type EO-PO-EO (see infra). In one embodiment of the invention, R=R'. In another embodiment of the invention, R≠R'. If z≠0, then z is typically=6-100.

Preferred degrees of polymerization are found further down.

In one embodiment of the invention, the emulsifier (B) is one represented by the formula (Ia):

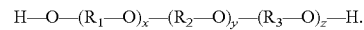

In one embodiment of the invention, the emulsifier (B) is one represented by the formula (Ib):

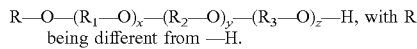
R—O—$(R_1$—O$)_x$—$(R_2$—O$)_y$—$(R_3$—O$)_z$—H, with R being different from —H.

In one embodiment of the invention, the emulsifier (B) is one represented by the formula (Ic):

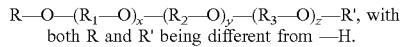
R—O—$(R_1$—O$)_x$—$(R_2$—O$)_y$—$(R_3$—O$)_z$—R', with both R and R' being different from —H.

Possibly a mix of two or more of the above emulsifiers (B) is being used.

Compositions of the invention allow to obtain high solid content products (e.g. of 65%) with an excellent colloidal stability (e.g. superior to 10 days at 60° C.). From compositions of the invention hardcoats can be prepared with properties comparable to 100% UV resins.

Compounds (A) of the invention comprise at least one, and typically at least two polymerizable ethylenically unsaturated groups per molecule, also referred to here as "ethylenically unsaturated functional groups" or "ethylenically unsaturated groups". By "polymerizable ethylenically unsaturated groups" throughout the invention is meant to designate in the present invention carbon-carbon double bonds which can undergo radical polymerization under the influence of irradiation, all then not in the presence of a (photo)initiator. Examples of such groups are (meth)acryloyl, (meth)acrylamide, vinyl, vinylether, allyl, maleyl or fumaryl functional groups. The polymerizable ethylenically unsaturated groups are generally chosen from (meth)acryloyl groups and/or allyl groups, preferably they are (meth) acryloyl groups, most preferably acryloyl groups. In the present invention, the term "(meth)acryloyl" is to be understood as to encompass both acryloyl and methacryloyl groups or derivatives as well as mixtures thereof.

Compounds (A) of the invention can be any type of water-insoluble compounds known in the art. By "a water-insoluble compound" is meant to designate in the present invention an ethylenically unsaturated compound that is not self-emulsifiable or self-dispersible, but forms emulsions or dispersions in water or in aqueous solutions in the presence of one or more emulsifiers (B) as defined. More in particular compounds (A) are non self-dispersible, non self-emulsifiable, non water-dilutable compounds. Typically compounds (A) of the invention are not self-dispersible compounds. By a "self-dispersible compound" is meant to designate in the present invention a compound that, when mixed with water, forms a stable two-phase system of small particles dispersed in water without the aid of an additional emulsifier. By a "self-emulsifiable compound" is meant to designate in the present invention a compound that, when mixed with water, forms a stable two-phase system of small droplets dispersed in water without the aid of an additional emulsifier. Typically compounds (A) of the invention are not water-dilutable compounds. By "stable" is meant to designate herein that there is substantially no coalescence (droplets) nor flocculation (particles) leading to phase separation, creaming or sedimentation of the heterogeneous system after 2 or more days, typically 4 or more days, preferably not even after 10 days at 60° C. By a "water-dilutable compound" is meant to designate in the present invention a compound that permits to form a homogeneous, single phase mixture when the compound is mixed with water over a concentration range of 5 to 75 wt % of water in the total mass of water and the compound, and this in the absence of emulsifiers.

Typically compounds (A) of the invention do not comprise any pendant hydrophilic groups (like carboxylic acid, sulfonic or phosphonic acid groups, or the corresponding salt) nor any alkylene oxide segments in an amount that would render the compound self-dispersible, self-emulsifiable or water-soluble.

Compounds (A) typically are characterized by an amount of copolymerizable ethylenically unsaturated groups of at least 4 meq/g, typically at least 5 meq/g, preferably at least 6 meq/g, more preferably at least 7 meq/g, even more preferably at least 8 meq/g, and most preferably at least 9 meq/g. Typically this amount does not exceed 13 meg/g, more preferable does not exceed 12 meq/g.

The amount of ethylenically unsaturated groups is usually measured by nuclear magnetic resonance spectroscopy (NMR) and is expressed in meq per g of solid material. A sample of dry product is dissolved in N-methylpyrolidinone. This sample is submitted to 1H-NMR analysis in order to measure the molar concentration of ethylenically unsaturated groups using 1,3,5-bromobenzene as internal standard. The comparison between the peak assigned to aromatic protons of the internal standard and the peaks assigned to the ethylenically unsaturated double bonds allow to calculate the molar concentration of ethylenically unsaturated groups according to the formula (A×B)/C wherein A is the integration of 1H double bonds provided by the sample, B is the number of moles of the internal standard in the sample and C is the integration of 1H provided by the internal standard.

Alternatively, the amount of ethylenically unsaturated groups can also be measured by a titration method following the addition of an excess of pyridinium sulfate dibromide on said unsaturated groups (within glacial acetic acid as solvent and mercury acetate as catalyst). Said excess liberates iodine in the presence of potassium iodide and the iodine is then titrated with sodium thiosulfate.

Preferred are compounds (A) that comprise at least 3, typically at least 4, more preferably at least 5, even 6 or more ethylenically unsaturated functional groups per molecule.

Even more preferred are compounds that combine a functionality and degree of unsaturation as indicated above. As such, particularly preferred are compounds (A) characterized by a functionality of at least 3 ethylenically unsaturated groups per molecule, typically at least 4, more preferably at least 5, even 6 or more ethylenically unsaturated groups per molecule; and by an amount of ethylenically unsaturated groups of at least 4 meq/g, typically at least 5 meq/g, preferably at least 6 meq/g, more preferably at least 7 meq/g, even more preferably at least 8 meq/g, and most preferably at least 9 meq/g. Typically the amount of ethylenically unsaturated groups does not exceed 13 meg/g, more preferable does not exceed 12 meq/g. In general the ethylenically unsaturated groups are (meth)acryloyl groups.

Typically compounds (A) are (meth)acrylated compounds. Preferably, compounds (A) of the invention are selected from one or more of: urethane (meth)acrylates (A1), polyester (meth)acrylates (A2), polyepoxy (meth)acrylates (A3), polycarbonate (meth)acrylates (A4), polyether (meth) acrylates (A5), and polyacrylic (meth)acrylates (A6). Most preferred are urethane (meth)acrylates and/or polyester (meth)acrylates.

Urethane (meth)acrylates (A1) typically are obtained from the reaction of at least one polyisocyanate (i), at least one polymerizable ethylenically unsaturated compound (ii) containing at least one reactive group capable to react with isocyanate groups, and optionally at least one other compound (iii) that contains at least one reactive group capable to react with isocyanate groups. By "other" is meant that compounds (iii) are different from compounds (ii). The "reactive groups capable to react with isocyanate groups"

can be hydroxyl groups, amino groups and/or thiol groups. Most typically however they are hydroxyl groups.

By a polyisocyanate (i) is meant to designate a compound containing at least two isocyanate groups. Typically the polyisocyanate contains not more than six isocyanate groups, more preferably not more than three isocyanate groups. Most typically it is a diisocyanate. The polyisocyanate is generally selected from aliphatic, cycloaliphatic, aromatic and/or heterocyclic polyisocyanates, or combinations thereof.

Examples of aliphatic and cycloaliphatic polyisocyanates that may be used are: 1,6-diisocyanatohexane (HDI), 1,1'-methylene bis[4-isocyanatocyclohexane] (H12MDI), 5-isocyanato-1-isocyanatomethyl-1,3,3-trimethylcyclohexane (isophorone diisocyanate, IPDI). Aliphatic polyisocyanates containing more than two isocyanate groups are for example the derivatives of above mentioned diisocyanates like 1,6-diisocyanatohexane biuret and trimer. Examples of aromatic polyisocyanates that may be used are 1,4-diisocyanatobenzene (BDI), 2,4-diisocyanatotoluene (TDI), 1,1'-methylenebis[4-isocyanatobenzene] (MDI), xylilene diisocyanate (XDI), tetramethylxylilene diisocyanate (TMXDI), 1,5-naphtalene diisocyanate (NDI), tolidine diisocyanate (TODI) and p-phenylene diisocyanate (PPDI).

The amount of polyisocyanate compound (i) used for the synthesis of the urethane (meth)acrylate (A1) is generally in the range of from 10 to 70 percent by weight (wt %), preferably from 15 to 60 wt % and more preferably from 20 to 50 wt %. Weight percentages are herein relative to the total weight of compounds used to prepare urethane (meth)acrylates (A1).

Compounds (ii) typically are (meth)acrylated compounds. Most often they are (meth)acrylated compounds containing essentially one reactive group capable to react with isocyanate groups. Such compounds typically comprise at least one unsaturated function such as acrylic or methacrylic groups and one nucleophilic function capable of reacting with isocyanate. This can be a hydroxyl, amino and/or thiol group, but typically is a hydroxyl group.

Typically compounds (ii) are hydroxyl functional (meth)acrylates and more in particular (meth)acryloyl mono-hydroxy compounds, or compounds comprising one hydroxyl group and one or more (meth)acryloyl groups. Acrylates are particularly preferred.

Suitable are for instance the esterification products of aliphatic and/or aromatic polyols with (meth)acrylic acid having a residual average hydroxyl functionality of about 1.

Examples of suitable hydroxyl functional (meth)acrylates (ii) include but are not limited to hydroxyethyl (meth)acrylate, hydroxypropyl (meth)acrylate, hydroxybutyl (meth)acrylate, polyethyleneoxide mono(meth)acrylate, polypropyleneoxide mono(meth)acrylate, or any of those hydroxylated monomers further reacted with lactones or lactides which add to these hydroxyls in a ring-opening reaction.

Suitable are also the esterification products of aliphatic and/or aromatic polyols with (meth)acrylic acid having a residual average hydroxyl functionality of about 1 or higher. The partial esterification products of (meth)acrylic acid with tri-, tetra-, penta- or hexahydric polyols or mixtures thereof are preferred but it is also possible to use reaction products of such polyols with ethylene oxide and/or propylene oxide or mixtures thereof, or the reaction products of such polyols with lactones or lactides which add to these polyols in a ring-opening reaction until the desired residual hydroxyl functionality is reached. It is known to those skilled in the art that the (meth)acrylation of polyols proceeds to a mixture of (meth)acrylate components and that an easy and suitable way to characterize the mixture is by measuring its hydroxyl value (mg KOH/g). Suitable compounds (ii) are for instance the (meth)acrylic esters of linear and branched polyols in which at least one hydroxy functionality remains free. Particularly preferred are compounds comprising at least two (meth)acryl functions such as glycerol diacrylate, trimethylolpropane diacrylate, pentaerythritol triacrylate, ditrimethylolpropane triacrylate, dipentaerythritol pentaacrylate and their (poly)ethoxylated and/or (poly)propoxylated equivalents. Particularly preferred are pentaerythritol triacrylate (PETIA) and a dipentaerythrytol hydroxypentaacrylate (DPHA), a mixture containing essentially dipentaerythritol tetraacrylate, dipentaerythritol pentaacrylate and dipentaerythritol hexaacrylate.

Also suitable are C1-4 hydroxyalkyl(meth)acrylate-((poly)lactone)t compounds, wherein t is an integer of from 1 to 10, preferably from 1 to 5. Preferably the (poly)lactone is a (poly)caprolactone. Examples of useful compounds in this category are Tone M100 (Dow Chemicals) and/or Bisomer PEMCURE 12A (Cognis). Other examples of suitable compounds (ii) are C1-4 hydroxyalkyl(meth)acrylate-((poly)lactide)n compounds, wherein n is an integer between 1 and 10, preferably n is between 1 and 5 and most preferably n is between 2 and 4.

Also suitable are the reaction products of (meth)acrylic acid with aliphatic, cycloaliphatic or aromatic compounds that bear an epoxy functionality and that, optionally, further bear at least one (meth)acrylic functionality. It is also possible to use compounds obtained from the reaction of an aliphatic, cycloaliphatic or aromatic compound containing at least one carboxylic acid with another compound bearing an epoxy functionality and at least one (meth)acrylic functionality. Particularly suitable is the reaction of the glycidyl ester of a C9-C11 versatic acid with (meth)acrylic acid.

From the above in particular poly(meth)acryloyl monohydroxy compounds, or compounds comprising one hydroxyl group and two or more (meth)acryloyl groups are preferred.

The amount of compounds (ii) used for the synthesis of the urethane (meth)acrylate (A1) is generally in the range of from 10 to 90 wt %, preferably from 40 to 85 wt % and more preferably from 50 to 80 wt %.

Weight percentages are herein relative to the total weight of compounds used to prepare urethane (meth)acrylates (A1).

Optionally, other hydroxyl functional compounds (iii) can be used for preparing urethane (meth)acrylates (A1) of the invention. Compounds (iii) typically are polyols and more in particular diols. In general compounds (iii) are saturated polyols.

By polyol (iii) is meant to designate an organic compound comprising at least two hydroxyl groups. The polyol (iii) can be selected from low molecular weight polyols having a number average weight of less than 300, preferably less than 200 Daltons; from high molecular weight polyols having a number average molecular weight of at least 300, preferably at least 400, more preferably at least 500 Daltons; or from any mixtures thereof. The high molecular weight polyol (iii) preferably has a number average molecular weight of at most 5,000, preferably at most 2,000, more preferably at most 1,000 Daltons.

Examples of suitable low molecular weight compounds (iii) include compounds like aliphatic or cycloaliphatic polyols such as ethyleneglycol (EG), propyleneglycol (PG), cyclohexane dimethanol (CHDM), glycerol (GLY), trimethylolpropane (TMP), ditrimethylolpropane (di-TMP), pentaerythrytol (PENTA), dipentaerythritol (di-PENTA), or any other renewable polyols like fatty dimer diols, and the like.

Examples of high molecular weight polyols (iii) are polyester polyols, polyether polyols, polycarbonate polyols, polybutadiene polyols, polyacrylate polyols and silicone polyols, as well as combinations thereof. Preferred are polyester polyols, polycarbonate polyols and/or polyether polyols, having a molecular weight above 500 Daltons. Particularly preferred are polyhydroxylated polyester polyols. Examples of such compounds are well known in the art.

Where present, compounds (iii) are generally used in an amount from 1 to 95 wt %, preferably from 2 to 20 wt % more preferably from 3 to 10 wt %, and most preferably from 5 to 10 wt %. Weight percentages are herein relative to the total weight of compounds used to prepare urethane (meth)acrylates (A1).

In an embodiment of the invention, urethane (meth) acrylates are prepared from compounds (i), (ii) and the optional compound (iii) as identified above. Typically the sum of the weight percentages of compounds (i), (ii) and (iii) equals 100%. In an embodiment of the invention compounds (iii) are used to prepare urethane (meth)acrylates (A11) of the invention. In yet another embodiment of the invention, no compounds (iii) are used to prepare compounds (A1) according to the invention. Especially preferred are urethane (meth)acrylates (A12) that are obtained from the reaction of at least one polyisocyanate (i) and at least one polymerizable ethylenically unsaturated compound (ii) containing at least one reactive group capable to react with isocyanate groups as described above. Typically the sum of the weight percentages of compounds (i) and (ii) herein equals 100%.

Typically urethane (meth)acrylates (A1) that are used in the invention have a molecular weight MW of between 400 and 20,000 Daltons. Usually the MW is at most 5,000 Daltons, typically at most 2,000 Daltons, and most typically at most 1,000 Daltons. Molecular weights can be measured by gel permeation chromatography using polystyrene standards but most typically they are calculated from the target molecule.

Optionally urethane (meth)acrylates (A1) of the invention can have residual amounts of hydroxyl functions. In general the residual amount of hydroxyl functions is between 0 and 5 meq/g. Typically the residual amount of hydroxyl functions is at most 3 meq/g, more typically at most 1 meq/g.

Examples of suitable urethane (meth)acrylates (A1) are those commercialized as EBECRYL® 1290, EBECRYL® 220, EBECRYL® 270, EBECRYL® 264, EBECRYL® 294/25HD, EBECRYL® 4883, EBECRYL® 5129 and EBECRYL® 8210. These urethane (meth)acrylates can be diluted in a reactive diluent or be used in combination with other (meth)acrylated compounds.

Polyester (meth)acrylates (A2) used in the invention typically are obtained from the reaction of at least one polyol (iii) and at least one ethylenically unsaturated carboxylic acid (iv) or a suitable equivalent.

Examples of suitable compounds (iv) include (meth) acrylic acid, β-carboxyethyl(meth)acrylate, crotonic acid, iso-crotonic acid, maleic acid, fumaric acid, itaconic acid, citraconic acid, 3-(meth)acrylamido-3-methylbutanoic acid, 10-(meth)acrylamido-undecanoic acid, 2-(meth)acrylamido-2-hydroxyacetic acid, vinyl acetic acid and/or allyl acetic acid. Acrylic acid and methacrylic acid, used alone or in combination, are preferred.

Suitable polyester (meth)acrylates (A2) are for instance aliphatic or aromatic polyhydric polyols which have been totally esterified with (meth)acrylic acid and may contain a residual hydroxyl functionality in the molecule; an easy and suitable way to characterize the product is thus by measuring its hydroxyl value (mgKOH/g). Suitable are the partial or total esterification products of (meth)acrylic acid with di-, tri-, tetra-, penta- and/or hexahydric polyols and mixtures thereof. It is also possible to use reaction products of such polyols with ethylene oxide and/or propylene oxide or mixtures thereof, or reaction products of such polyols with lactones and lactides, which add to these polyols in a ring-opening reaction. Examples of poly-unsaturated compounds from this category are dipropyleneglycol di-acrylate, trimethylolpropane tri-acrylate, glycerol tri-acrylate, pentaerythritol tetra-acrylate, di-trimethylolpropane tetra-acrylate, dipentaerythritol hexa-acrylate and their (poly)ethoxylated and/or (poly)propoxylated equivalents, as well as mixtures thereof. Partial acrylation products from these examples are also considered.

Polyester (meth)acrylates (A2) with a higher molecular weight (e.g. a MW above 500 Daltons, preferably above 750 Daltons, more preferably above 1.000 Daltons) can also be obtained by reacting a hydroxyl group-containing polyester with (meth)acrylic acid, or by reacting a carboxylic acid group-containing polyester with a hydroxyalkyl (meth)acrylate such as for example 2-hydroxyethyl acrylate, 2- or 3-hydroxypropyl acrylate, etc., or with glycidyl (meth)acrylate. The polyester backbone can be obtained in a conventional manner by polycondensation of at least one mono- and/or polyhydroxy alcohol, such as ethylene glycol, propylene glycol, butanediol, neopentyl glycol, hexanediol, trimethylolpropane, bisphenol A, pentaerythritol, etc, or/and the ethoxylates and/or propoxylates thereof, with at least one mono- and/or polycarboxylic acid such as adipic acid, phthalic acid, isophthalic acid, terephthalic acid, trimellitic acid, etc. By using unsaturated compounds for the polyester synthesis, such as for example fumaric acid, maleic acid, itaconic acid, etc., polyesters bearing both (meth)acrylic and ethylenic unsaturations in the polymer chain, can be obtained. In addition polylactones and/or polylactides can be used as polyester backbone. For example poly(ε-caprolactone) obtained by ring-opening polymerization of ε-caprolactone, optionally in the presence of one or more polyhydroxy alcohol, can be used. In a particular embodiment of the invention the polyester (meth)acrylate (A2) is an alkyd, more in particular is a (meth)acrylated alkyd.

In another embodiment of the invention the polyester (meth)acrylate (A2) is not an alkyd, more in particular is not a (meth)acrylated alkyd. By using an alkyd structure, it is possible to encompass its typical coating features like glossy finishes together with an increased content of renewable raw materials (fatty acids).

Typically polyester (meth)acrylates (A2) have a MW of between 200 and 20,000 Daltons. Usually the MW is at most 5,000 Daltons, typically at most 1,000 Daltons, most typically at most 500 Daltons.

Suitable polyester acrylates (A2) are for instance those commercialized as EBECRYL®800, EBECRYL®830 and EBECRYL®884.

Polyepoxy (meth)acrylates (A3) that are used in the invention can be obtained from the reaction of (meth)acrylic acid with polyepoxides, i.e. compounds comprising at least two epoxide functions. The polyepoxides are generally chosen from glycidyl ethers of aromatic or aliphatic alcohols, polyols and from cycloaliphatic polyepoxides. Preferred epoxides are diglycidylethers of aromatic, aliphatic and/or cycloaliphatic diols, such as diglycidyl ether of bisphenol-A, diglycidyl ether of bisphenol-F, diglycidylether of poly(ethylene oxide-co-propylene oxide), diglycidylether of polypropylene oxide, diglycidylether of hexanediol, diglycidylether of pentanediol, diglycidylether of butanediol. Particularly preferred is diglycidyl ether of bisphenol-A. Also epoxidized unsaturated fatty acid triglycerides or epoxidized novolacs can be used. Examples include epoxidized soya oil, epoxidized castor oil, epoxidized linseed oil and the like.

Polyether (meth)acrylates (A4) that are used in the invention can be prepared by esterification of hydroxyfunctional polyethers with an ethylenically unsaturated carboxylic acid like (meth)acrylic acid. For more examples—see compounds (iv) above.

Hydroxyfunctional polyethers are obtained by ring-opening homo- or copolymerization of cyclic ethers such as tetrahydrofuran, ethylene oxide and/or propylene oxide or can be prepared by reacting polyhydroxy alcohols with ethylene and/or propylene oxide.

Polycarbonate (meth)acrylates (A5) that are used in the invention can be prepared by esterification of hydroxyfunctional polycarbonates with an ethylenically unsaturated carboxylic acid like (meth)acrylic acid like. For more examples—see compounds (iv) above.

Poly(meth)acrylic (meth)acrylates (A6) that are used in this invention can be prepared by the radical polymerization of (meth)acrylic monomers in the presence of thermal radical initiators, transfer agents and optional (reactive) solvents; a chemical functionality is introduced on the acrylic backbone to ensure the subsequent grafting with suitable mono- or poly-(meth)acrylated compounds. For example, the (meth)acrylic oligomer bears carboxylic acid functionality and is grafted with glycidyl (meth)acrylate (or vice versa). Suitable (meth)acrylated (meth)acrylics of this type are commercialized as EBECRYL®1200.

In one particular embodiment, compositions of the invention comprise at least one urethane (meth)acrylate (A1) as described above, and optionally at least one polyester (meth)acrylate (A2) as described above.

In another particular embodiment, compositions of the invention comprise at least one polyester (meth)acrylate (A2) as described above.

In yet another particular embodiment, compositions of the invention comprise at least one urethane (meth)acrylate (A1) and at least one polyester (meth)acrylate, more in particular at least one polyester (meth)acrylate (A2) as described above.

In an embodiment of the invention, compositions of the invention comprise two or more different compounds (A), that typically are selected from two or more of the group of urethane (meth)acrylates (A1), polyester (meth)acrylates (A2), polyepoxy (meth)acrylates (A3), polyether (meth)acrylates (A4), polycarbonate (meth)acrylates (A5) and/or poly(meth)acrylic (meth)acrylates (A6) as described above. Possibly two urethane (meth)acrylates (A1) of a different type are present.

The emulsifier (B) is capable of bringing compounds (A) into emulsion or dispersion. An advantage is that by using an emulsifier (B) of the invention one is able to maintain the colloidal stability over a large range of temperatures, for instance from 4 up to 60° C., more typically from room temperature up to 60° C.

An advantage of the invention is that colloidal stability at 60° C. can be maintained for at least a few days, typically at least 4 days, even up to 10 days and more.

Most typically emulsions are obtained and most in particular oil-in-water emulsions. By an "oil-in-water emulsion" is meant to designate in the present invention an emulsion whose dispersed phase is a water-insoluble organic phase, present as droplets, and whose dispersing phase is water or a water solution.

Emulsifiers (B) of the invention typically comprise alternating sequences of polyethylene oxide moieties and polypropylene oxide moieties. Optionally these emulsifiers (B) can bear one or more residual groups selected from: alkyl groups, aryl groups, hydroxyl groups and/or copolymerizable ethylenically unsaturated groups. Usually these optional groups are selected from: alkyl groups, hydroxyl groups and/or copolymerizable ethylenically unsaturated groups. Even more preferred are alkyl groups and/or copolymerizable ethylenically unsaturated groups.

The optional alkyl group can be a C1-C18 alkyl group but typically it is a C1-14 alkyl group, more typically it is a C1-12 alkyl group, and most typically a C1-4 alkyl group (like e.g. a butyl group).

Typically the copolymerizable ethylenically unsaturated groups that may be present on emulsifiers (B) of the invention are selected from allyl groups and/or (meth)acryloyl groups. Most typically they are (meth)acryloyl groups. The above-mentioned optional groups typically are terminal groups.

In an embodiment of the invention, the emulsifier (B) does not bear any of the above optional groups. In another embodiment of the invention, the emulsifier (B) is bearing at least one of the above optional groups. Usually these optional groups are selected from: alkyl groups, hydroxyl groups and/or copolymerizable ethylenically unsaturated groups. Even more preferred are alkyl groups and/or copolymerizable ethylenically unsaturated groups Typically emulsifiers (B) have a content of alternating polyalkylene oxide units that is at least 22.5% by weight relative to the total weight of the emulsifier (B), usually at least 50% by weight. More typically however this content is at least 75% by weight, more preferably at least 90% by weight, most preferably at least 95% by weight and the most preferably at least 98% by weight. This weight % can be up to 100% (in case that the optional groups specified above are nor present). In a preferred embodiment however at least one of these groups is present and preferably the emulsifier is an asymmetric molecule meaning that end groups are different at both sides of the molecule.

The alternating polyalkylene oxide segments are typically alternating polyethylene oxide segments and polypropylene oxide segments. Di-bloc and/or tri-bloc emulsifiers are generally preferred. Of tri-bloc emulsifiers those of the type EO-PO-EO are preferred. In an embodiment of the invention the emulsifier (B) has an amount of oxyethylene units derived from polyethylene glycol of from 20% to 80% in weight, relative to the total weight of the emulsifier (B).

In an embodiment of the invention the emulsifier (B) has an amount of oxypropylene units derived from polypropylene glycol of from 20% to 80% in weight, relative to the total weight of the emulsifier (B).

The emulsifier (B) typically is a non-ionic emulsifier. Acid groups (like carboxylic acid groups, sulfonic acid groups or phosphonic acid groups), amino groups or epoxy groups, if present at all initially, typically are chemically grafted in a second step to provide another functionality for the emulsifier, like e.g. (meth)acryloyl groups, so that the resulting emulsifier (B) is a non-ionic emulsifier. For instance acid groups like carboxylic acid groups can be used to provide (meth)acryloyl groups to the emulsifier (B) by reaction with a (meth)acrylating compound (D) comprising functional groups capable of reacting with said carboxylic acid groups as well as at least one copolymerizable ethylenically unsaturated group.

Preferred are di-bloc and tri-bloc copolymers. Yet if the emulsifier (B) is a tri-bloc emulsifier then typically it is one of type EO-PO-EO. Emulsifiers (B) of the type PO-EO-PO were found less suitable for use in the present invention unless they had an HLB value (or a weighted average of HLB values) of at least 9 preferably at least 10. Most preferred are di-bloc copolymers.

Polyethylene oxide moieties (or segments) typically have a degree of polymerization comprised between 6 and 100 units. Often the degree of polymerization is at least 20, more preferably at least 40. Often the degree of polymerization is at most 80 and usually at most 60. Polypropylene oxide moieties (or segments) typically have a degree of polymerization comprised between 6 and 100 units. Often the degree of polymerization is at least 10, more preferably at least 20. Often the degree of polymerization is at most 80 and usually at most 60.

Typically one or more emulsifiers (B) with a HLB value (or with a weighted average of HLB values) of at least 4.5 is present in the composition of the invention. The term "HLB" stands for the "Hydrophilic-Lipophilic Balance" of the emulsifier(s) and is defined as the weight percentage of polyethylene oxide in the molecule, divided by 5. By definition, HLB values are restricted between the excluded values of 0 and 20 for nonionic emulsifiers. HLB values can be measured by direct or indirect methods. Typically though, HLB values are determined by NMR spectroscopy, for instance using the method below.

In the present invention, the HLB value of emulsifiers was investigated by $^1$H-COSY NMR spectroscopy on a Bruker®Avance 500 MHz spectrometer with deuterated chloroform $CDCl_3$ as solvent. For instance in the case of the analysis of Maxemul® 7101, the molar propoxy-contribution $—CH_2—CH(CH_3)—O—$ is determined by the integration of the 3 protons H1 of Methyl ($CH_3$) with a chemical shift at 1.15 ppm. The molar ethoxy-contribution $—CH_2—CH_2—O—$ is determined by the integration of the 4 protons (H4+H5) of the methylene ($—CH_2—CH_2—$) segment from ethoxy-unit subtracted with the additional contribution of methylene ($—CH—CH_2—$) from propoxy-unit (H2+H3) at the chemical shift range between 3.30 to 3.70 ppm.

The molar ethoxy/propoxy ratio (r) is defined as $$\frac{[[(H4+H5)-(H2+H3)]/4]}{[H1/3]},$$

and permits the easy calculation of the HLB=20r/(1+r)

(Figure)

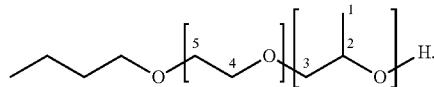

In general the HLB value (or the weighted average of HLB values) is at least 5, typically is at least 6. Preferably the HLB value is at least 7, more preferably at least 8, even more preferably at least 9, and most preferably at least 10. Typically the HLB value is at most 19, preferably at most 18, more preferably at most 17, and most preferably at most 16. If the HLB value is too high then there is a risk of obtaining and stabilizing foams. A too low or too high HLB value often has a strong negative impact on stability of the oil-in-water composition.

Preferred are HLB values (or a weighted average of HLB values) between 7 and 19, more preferred are values between 8 and 18, even more preferred are values between 9 and 17, more typical are values between 10 and 17, and most preferred are values between 10 and 16.

Emulsifiers with a high HLB value will be more hydrophilic (water soluble) and emulsifiers with a low HLB value will be more lipophilic (oil soluble). Emulsions of the invention will usually be stabilized depending on the HLB requirements of the oil component. The term "oil" is herein taken as a generic name that encompasses all the (meth) acrylated compounds (A) present in the composition of the invention.

Matching the HLB requirement of compounds (A) with the HLB value of the emulsifier (B) yields optimum emulsion stability and performance. This can be explained by the fact that the emulsifier should preferentially be present at the oil-water interphase in order to provide the most efficient stabilization.

This situation corresponds to the match between the HLB request of compounds (A) and the HLB value of emulsifier (B). If e.g. the HLB value of the emulsifier (B) is too low compared with the HLB request of compounds (A), then the emulsifier (B) will tend to have a higher affinity for the components (A) and be less efficient at the droplet interphase to provide colloidal stability.

Possibly, a blend of emulsifiers is used with a weighted average of HLB values of at least 4.5, typically at least 5, more typically at least 6, and preferably at most 19 (for preferred values see above). In said case, the HLB value referred to typically is the weighted average of the HLB values of the blended emulsifiers.

It is indeed known as a rule to those skilled in the art that the HLB value of an emulsifier blend is the weighted average of the HLB values of the blended emulsifiers, i.e. a 50:50 blend of emulsifiers with HLB=4 and HLB=16 will have an HLB=10. Similarly, the HLB requirement (Req) of an oil blend is the weighted average of the HLB requirements of the blended components, i.e. a 50:50 blend of oils with Req=10 and Req=14 will have a Req=12.

Below a few examples of how to put this in practice:

It is thus possible to use one or more emulsifiers (B) of the invention in admixture with (or in a blend with) one or more other emulsifiers (C) having the same building blocks and chemical structure as emulsifiers (B) but having for instance a lower or a higher HLB than indicated above. Examples of compounds (C) are e.g. emulsifiers (C1) comprising (or consisting essentially of) alternating polyalkylene oxide segments (in particular alternating polyethylene oxide segments and polypropylene oxide segments), wherein said emulsifier optionally bears one or more groups selected from alkyl groups, aryl groups, hydroxyl groups and/or ethylenically unsaturated groups as defined above, and wherein said emulsifiers have an HLB value lower than that of compounds (B) (e.g. <4.5). It is also possible to blend one or more emulsifiers (B) with one or more emulsifiers (C2) comprising (or essentially consisting of) alternating alkylene oxide segments (in particular alternating polyethylene oxide segments and polypropylene oxide segments), wherein said emulsifier optionally bears one or more groups selected from alkyl groups, aryl groups, hydroxyl groups and/or ethylenically unsaturated groups as defined above, and wherein said emulsifiers have an HLB value higher than that of compounds (B) (e.g. above 19 or as high as 19.5). It is equally well possible to use a blend of emulsifiers (C1) and (C2) as described above as long as the weighted average of the HLB values of the blended emulsifiers is at least 4.5, preferably at least 5, most preferably at least 6, and preferably at most 19. For preferred HLB values, see above. For preferred optional groups, see also above.

In an embodiment of the invention, a blend of at least one emulsifier (B) and of at least one emulsifier (C) is used. In another embodiment of the invention, no emulsifiers other than emulsifiers (B) are used.

Typically emulsifiers (B) have a molecular weight MW of between 700 and 10.500 Daltons. Molecular weights typically are calculated. Typically the MW is at least 3.000 Daltons and typically at most 7.000 Daltons.

Most typically emulsifiers (B) of the invention are comprised of (or essentially consist of) alternating polyethylene oxide segments and polypropylene oxide segments, with the proviso that compounds (B) can optionally bear one or more groups selected from alkyl groups, aryl groups, hydroxyl groups and/or copolymerizable ethylenically unsaturated groups as defined above.

Particularly preferred are di-bloc and/or tri-bloc copolymers that are comprised of (or essentially consist of) alternating sequences of polyethylene oxide (EO) moieties and polypropylene oxide (PO) moieties, which compounds (B) can optionally bear at least one terminal hydroxyl, alkyl and/or ethylenically unsaturated group. Again, the ethylenically unsaturated groups typically are (meth)acryloyl groups.

In a first variant of the invention, emulsifiers (B) are di-bloc copolymers. Particularly preferred are di-bloc copolymers that are comprised of (or essentially consist of) alternating sequences of (i) polyethylene oxide with a degree of polymerization comprised between 6 and 100 units, preferably between 20 and 80 units, most preferably between 40 and 60 units, and of (ii) polypropylene oxide with a degree of polymerization comprised between 6 and 100 units, preferably between 20 and 80 units, most preferably between 40 and 60 units. Optionally these emulsifiers (B) can bear one or more optional groups as defined above such as terminal hydroxyl, alkyl and/or ethylenically unsaturated groups. Of the optional groups in particular alkyl groups and/or ethylenically unsaturated groups are preferred. Once more, the ethylenically unsaturated groups typically are (meth)acryloyl groups. Typically emulsifiers (B) of this type have a molecular weight MW of between 700 and 10,000 Daltons. Preferably the MW is at least 2,000 Daltons, more preferably at least 3,000 Daltons and most preferably at least 4,000 Daltons. Preferably the MW is at most 8,000 Daltons, more preferably at most 7,000 Daltons and most preferably at most 6,000 Daltons.

In a second variant of the invention, emulsifiers (B) are tri-bloc copolymers, in particular tri-bloc copolymers of the type EO-PO-EO. By an "EO-PO-EO type" is meant to designate that the emulsifier contains alternating sequences of (i) polyethylene oxide, of (ii) polypropylene oxide, and of (iii) polyethylene oxide moieties. Particularly preferred are tri-bloc copolymers that are comprised of (or essentially consist of) alternating sequences of (i) polyethylene oxide with a degree of polymerization comprised between 6 and 100 units, preferably between 10 and 80 units, most preferably between 20 and 60 units, of (ii) polypropylene oxide with a degree of polymerization comprised between 6 and 100 units, preferably between 10 and 80 units, most preferably between 20 and 60 units, and of (iii) polyethylene oxide with a degree of polymerization comprised between 6 and 100 units, preferably between 10 and 80 units, most preferably between 20 and 60 units. Optionally these emulsifiers (B) can bear one or more optional groups as defined above such as terminal hydroxyl, alkyl and/or ethylenically unsaturated groups. Of the optional groups in particular alkyl groups and/or ethylenically unsaturated groups are preferred. Typically the ethylenically unsaturated groups are (meth)acryloyl groups.

Typically emulsifiers (B) of this type have a molecular weight MW of between 800 and 15,000 Daltons. Preferably the MW is at least 2,000 Daltons, more preferably at least 3,000 Daltons and most preferably at least 4,000 Daltons. Preferably the MW is at most 10,000 Daltons, more preferably at most 8,000 Daltons and most preferably at most 6,000 Daltons.

In a third variant of the invention, at least one emulsifier according to the first variant and at least one emulsifier according to the second variant are used in the composition of the invention.

Particularly preferred however are di-bloc copolymers as described above. Typically compounds (B) are characterized by an amount of copolymerizable ethylenically unsaturated groups from 0 to 1 meq/g.

In an embodiment of the invention emulsifiers (B1) are used that bear no copolymerizable ethylenically unsaturated groups. Optionally said emulsifier (B1) may further contain one or more groups selected from alkyl groups, aryl groups and/or hydroxyl groups. Preferred amongst these optional groups are alkyl and/or hydroxyl groups. Most preferred are alkyl groups. Typically these optional groups are terminal groups.

In an embodiment of the invention emulsifiers (B2) are used bearing at least one copolymerizable ethylenically unsaturated group. Optionally said emulsifier (B2) may further contain one or more groups selected from alkyl groups, aryl groups and/or hydroxyl groups. Preferred amongst these optional groups are alkyl and/or hydroxyl groups. Most preferred are alkyl groups. Typically these optional groups are terminal groups.

In yet another embodiment of the invention at least one emulsifier (B1) and at least one emulsifier (B2) may be used.

It was somewhat surprising that emulsifiers (B1) behaved practically as good as emulsifiers (B2), though the latter will have some advantages when it comes to cure speed, mechanical & chemical resistance and ageing for instance. In addition, migration problems and subsequent intercoat adhesion can be reduced by using emulsifiers (B2). This observation was attributed to the very high acrylate functionality of the hardcoat composition where the acrylation of the emulsifier becomes a marginal effect for the performance of the final cured coating. This would become less true in the case of more specific hardcoat performance demands or when less functionalized acrylate compounds are being emulsified for use outside hardcoats.

A separate aspect of the invention relates to an ethylenically unsaturated non-ionic emulsifier (B2) comprising at least one copolymerizable ethylenically unsaturated group, which typically is a (meth)acryloyl group. (Meth)acryloyl groups can be present on both sides of the groups but in a particular embodiment of the invention are present at one side only. Typical is an ethylenically unsaturated non-ionic emulsifier (B2) comprising alternating polyalkylene oxide segments. Optionally said emulsifier may further contain one or more groups selected from alkyl groups, aryl groups and/or hydroxyl groups.

Typically these optional groups are terminal groups.

In general, the emulsifier comprises (more in particular consists essentially of) alternating polyalkylene oxide segments. Typically the emulsifier comprises (more in particular consists essentially of) alternating polyethylene oxide segments and polypropylene oxide segments. Optionally said emulsifier may further contain one or more groups selected from alkyl groups, aryl groups and/or hydroxyl groups. Of the optional groups the following are preferred: alkyl groups and/or hydroxyl groups. Most preferred are alkyl groups.

A particularly preferred compound (B2) is one that bears at least one (meth)acryloyl group at one side and an alkyl group at the other side of the molecule. More info on preferred alkyl groups can be found above.

Typically the emulsifier has an HLB value of at least 4.5, preferably at least 5, more preferably at least 6, and preferably of at most 19. Preferred HLB values are given above. Yet, typical are HLB values between 7 and 19, more typical are values between 8 and 18, preferred are values between 9 and 17, more typical are values between 10 and 17, and most preferred are values between 10 and 16.

Often the amount of copolymerizable ethylenically unsaturated groups is at least 0.05 meq per g of compounds (B2), more often this amount is at least 0.1 meq/g, and most often at least 0.15 meq/g. This amount can be at least 0.2 meq/g. Typically this amount is at most 1 meq/g. Often this amount is at most 0.5 meq/g, more often at most 0.4 meq/g and most typically at most 0.3 meq/g. Typically the copolymerizable ethylenically unsaturated groups are (meth)acryloyl groups, more in particular acryloyl groups. Typically a (meth)acrylated emulsifier (B2) according to the invention will bear (meth)acryloyl groups in an amount from 0.05 to 1 meq/g, more typically in an amount from 0.05 to 0.5 meq/g, preferably in an amount from 0.1 to 0.4 meq/g, most preferably in an amount from 0.2 to 0.3 meq/g.

Ethylenic unsaturation (more in particular (meth)acryloyl groups) can be introduced in various different ways chosen in function of the reactive functional groups present on the emulsifier used to react with an ethylenically unsaturated compound (D) as defined below, either directly or via a linker (E).

Below a few examples of possible routes via which copolymerizable ethylenically unsaturated groups can be attached to said emulsifiers. Said emulsifier may an emulsifier (B1) as defined above, yet suitable for reaction with a compound (D), either directly of via a linker (E). Alternatively said emulsifier can be an emulsifier (B3) that comprises alternating polyalkylene oxide segments as defined above, as well as reactive groups capable to react with compounds providing ethylenically unsaturated groups, typically (meth)acryloyl groups. A few examples of suitable functional groups: hydroxyl groups, acid groups (more in particular carboxylic acid groups), epoxy groups or amino groups. Optionally said emulsifier (B3) can contain alkyl groups and/or aryl groups. The alternating polyalkylene oxide segments are typically alternating polyethylene oxide segments and polypropylene oxide segments.

Different ways of introducing ethylenic unsaturation to compounds (B2) exist. Copolymerizable ethylenically unsaturated groups can for instance be attached via the direct reaction between reactive functional groups on an ethylenically unsaturated compound (D) and reactive functional groups present on the emulsifier (B1) or (B3). Alternatively, they can be introduced by an indirect method, using a linker (E) (for instance an anhydride, or an epihalohydrin) that on one hand reacts with reactive functional groups on an ethylenically unsaturated compound (D) and on the other hand reacts with reactive functional groups present on the emulsifier (B1) or (B3).

By an ethylenically unsaturated compound (D) is meant to designate a compound comprising at least one copolymerizable ethylenically unsaturated group as well as at least one reactive groups capable of reacting with e.g. hydroxyl, amine or carboxylic acid groups present on the emulsifier (B1) or (B3), or in case the linker (E). The ethylenically unsaturated groups on compounds (D) typically are selected from (meth)acryloyl, vinyl, vinylether, allyl, maleyl, fumaryl and/or (meth)acrylamide functional groups. Typical are allyl groups and/or (meth)acryloyl groups. Preferred are (meth)acryloyl groups. Typically compounds (D) comprise at least one (meth)acryloyl group as well as at least one, more preferable essentially one (or one) reactive group capable to react with hydroxyl, amine or carboxylic acid groups.

In a first variant, the (meth)acrylation of emulsifiers (B) is achieved by reacting hydroxyl functionality present on the emulsifier (B1) or (B3) with an unsaturated acid and/or a suitable equivalent thereof (D1). Examples of suitable equivalents are for instance the acyl halide of the unsaturated acid or the corresponding anhydride of the unsaturated acid. Particularly suited for use in the present invention are (meth)acrylic acid, (meth)acrylic acid anhydride or a (meth)acrylic acid halide. Examples of suitable (meth)acrylic acid halides are (meth)acrylic acid chloride, (meth)acrylic acid bromide and/or (meth)acrylic acid iodide. When a (meth)acrylic acid halide is used and/or (meth)acrylic acid anhydride, it is desirable to work in a dehydrated state to avoid disassembly.

In a second variant, the (meth)acrylation of emulsifiers (B) is achieved by reacting hydroxyl functionality present on the emulsifier (B1) or (B3) with a lower alkyl ester (D2) of the unsaturated acid via a transesterification process. By a lower alkyl ester is meant to designate in particular the lower alcohol ester of an unsaturated acid such as (meth)acrylic acid. The lower alcohol preferably is an aliphatic C1-C4 alcohol. Preferred lower alkyl esters are for instance methyl esters, ethyl esters, n-propyl esters and/or iso-propyl esters of (meth)acrylic acid.

In a third variant, though somewhat less preferred, the (meth)acrylation of emulsifiers (B) is achieved by reacting amine functionality present on the emulsifier (B3) with epoxy functionalized compounds (D3) bearing at least one copolymerizable ethylenically unsaturated group, or with compounds (D1) as described above. Examples of these amine functionalized EO/PO polyetheramines (B3) are e.g. the Jeffamines® like for instance the Jeffamine® ED series that can be represented by the general formula II:

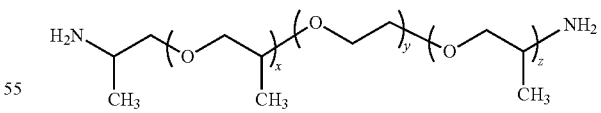

Examples of epoxy functionalized (meth)acrylating compounds (D3) are for instance glycidyl (meth)acrylate.

In a fourth variant, the (meth)acrylation of emulsifiers (B) is achieved by reacting ethylenically unsaturated compounds (D4) bearing at least one isocyanate group with hydroxyl or amine functionality present on the emulsifier (B1) or (B3). This can for instance be achieved by reacting an isocyanate containing vinyl compound (D4) such as TMI® (Cytec Industries, see Formula II) with hydroxyl or amine functionalized emulsifiers (B1) or (B3).

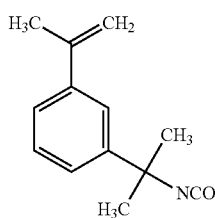

Formula III

Other examples of suitable compounds (D4) are 2-Isocyanatoethyl acrylate (AOI™—Showa Denko) and 2-Isocyanatoethylmeth acrylate (MOI™—Showa Denko).

In a fifth variant, the (meth)acrylation of emulsifiers (B) is achieved by reacting amine or hydroxyl functionality present on the emulsifier (B1) or (B3) with the reaction product (D5) (or adduct) of at least one polyisocyanate (v) and at least one compound (vi) containing at least one reactive group capable to react with isocyanate groups as well as at least one ethylenically unsaturated group, which typically is a (meth)acryloyl group. Compounds (v) may be selected from one or more polyisocyanate compounds (i) as described above and compounds (vi) from one or more compounds (ii) as described above. Preferred compounds (v) are those that contain at least one reactive group capable to react with isocyanate groups and at least one (meth)acryloyl group. Most preferred are those that contain at least one acryloyl and/or methacryloyl group and one (or essentially one) nucleophilic function capable of reacting with isocyanate groups, such as a hydroxyl group.

Another suitable route to incorporate ethylenically unsaturation into emulsifiers (B) makes use of epoxy compounds (E) with at least 2 epoxy groups as linkers. These epoxy compounds can be aliphatic, alicyclic or aromatic. Preferably these epoxy compounds are polyglycidyl ethers based on polyhydric alcohols, polyhydric phenols, or on hydrogenation products of these phenols and/or novolaks. A first example of this route makes use of the reaction of the epoxy group with a hydroxyl functionality present on the emulsifier (B1) or (B3) as described for instance in the patent application EP 2325221 (Cytec surface Specialties Austria). The quantities of hydroxyl groups and epoxy groups are chosen in such a way that the emulsifier (B) contains at least one epoxy group after the condensation reaction. Lewis acids such as boron trifluoride or antimonypentafluoride or complexes thereof with ethers or amines are the preferred catalysts for this reaction. The epoxy groups now present on the emulsifier (B) are then reacted, in a second step, with unsaturated acids (D1) as described above.

The same epoxy compounds (E) can also be reacted with polyetheramines like for instance the above described Jeffamine® ED series in a ratio such that all the amine groups are transformed into epoxy groups. These epoxy groups are then reacted in a second step with unsaturated acids (D1) as described above. A similar way of obtaining emulsifiers (B2) is by reacting those same epoxy compounds (E) with carboxylic acid functionality present on the emulsifier (B1) or (B3).

Yet another suitable route to incorporate unsaturated functionality into an emulsifier (B) consists of first reacting hydroxyl functionality present on an emulsifier (B1) or (B3) with an epihalohydrin, usually epichlorohydrin (E). In a second step the epoxy function now present on the emulsifier (B1') is then reacted, in a second step, with a compound (D) containing at least one reactive group capable to react with epoxy groups like e.g. a carboxylic acid group. An example of a suitable compound (D) is for instance a compound (D1) like e.g. (meth)acrylic acid.

Yet another suitable route consists of the Michael addition of primary or secondary amine functions present on the emulsifier (B1) or (B3) with ethylenically unsaturated compounds (D), preferably acrylated compounds containing at least two (meth)acryloyl groups, more in particular at least 2 acryloyl groups per molecule. The ratio between the total amount of ethylenically unsaturated functions, preferably reactive acryloyl functions, and the total amount of reactive amine groups typically is at least 2.

Yet another suitable route consists of reacting in a first step hydroxyl or amine functionality present on the emulsifier (B1) or (B3) with anhydrides (E) giving respectively an ester or amide bond and a carboxyl acid functional group that can be reacted, in a second step, with epoxy functionalized compounds (D4) such as glycidyl(meth)acrylate.

Typical examples of anhydrides (E) are for instance succinic anhydride, maleic anhydride, phthalic anhydride, trimellitic anhydride and/or pyromellitic anhydride. If ethylenically unsaturated anhydrides are used the process can be stopped after the first step.

Typically compounds (B2) are characterized by a conversion rate close to 100% of hydroxyl, amino and/or acids functional groups (typically carboxylic acid functional groups) initially present on the emulsifier (B1) or (B3). Preferred is to have a conversion rate of at least 90%, typically of at least 95%, more preferably of at least 99%.

Typically emulsifiers (B2) have a molecular weight MW of between 700 to 15,000 Daltons.

Particularly provided in the invention is an ethylenically unsaturated emulsifier (B2) that is comprised of (or consists of) alternating polyethylene oxide segments and polypropylene oxide segments, wherein said emulsifier bears at least one ethylenically unsaturated group, and optionally one or more groups selected from alkyl groups, hydroxyl groups and/or aryl groups, and wherein said emulsifier has an HLB value of at least 6. From the optional groups alkyl and/or hydroxyl groups are preferred, which groups most often are terminal groups. Typically said emulsifier (B2) is a non-ionic emulsifier. Ways to introduce ethylenic unsaturation have been described above. Typically the ethylenically unsaturated groups are (meth)acryloyl groups. For preferred HLB values, preferred levels of unsaturation, preferred optional groups, preferred molecular weight etc, see above.

Compositions of the invention can be prepared in various ways yet typically are prepared by blending compounds (A) and (B) and possibly other ingredients (like co-solvents) at a temperature between 20 to 80° C. under high shear using for instance a cowless propeller at 20 to 2000 rpm (depending on the cowless diameter, the vessel diameter and the volume to be stirred). Water is added during a period of time of between 5 and 60 minutes at a temperature of between 15° C. and 80° C. in such an amount to obtain an aqueous composition with a solid content corresponding to the phase inversion, typically near 80%.

Alternatively, the addition of the organic phase containing compounds (A) is made in water. In this case the emulsifier (B) can be added either to the organic phase or to water, or both. Typically the high shear conditions are maintained for 5 to 60 minutes, after which a second portion of water at a temperature between 15 to 80° C. is added to dilute the composition to the desired solid content. Alternatively the ingredients can be added to water but a catastrophic phase inversion process is usually preferred.

Blending at a shear rate of 10 to 200 rpm typically is continued for a for a period of time between 5 and 30 minutes at a temperature typically of between 15 and 30° C. until a stable emulsion is obtained.

In general compositions of the invention comprise, relative to the total weight of compounds (A) and (B), from 50 to 99.9 percent by weight (wt %) of compounds (A). Usually this amount is at least 80 wt %, often at least 90 wt %, more often at least 92 wt %. Often this amount is at most 99 wt %, more typically at most 98 wt %, and most typically at most 96 wt %. Typically compositions of the invention comprise, relative to the total weight of compounds (A) and (B), from 80 to 99 wt %, preferably from 90 to 98 wt %, most preferably from 92 to 96 wt % of compounds (A).

In general compositions of the invention comprise, relative to the total weight of compounds (A) and (B), from 0.1 to 50 wt % of compounds (B). Usually this amount is at least 1 wt %, often at least 2 wt %, more often at least 4 wt %. Often this amount is at most 20 wt %, more typically at most 10 wt %, and most typically at most 8 wt %. Typically compositions of the invention comprise, relative to the total weight of compounds (A) and (B), from 1 to 20 wt %, preferably from 2 to 10 wt %, more preferably from 4 to 8 wt % of compounds (B).

Compositions of the invention typically comprise from 5 to 65 wt % of compounds (A), more typically from 55 to 65 wt % relative to the total weight of the composition. Compositions of the invention typically comprise from 0.05 to 35 wt % of compounds (B), more typically from 2 to 6 wt % relative to the total weight of the composition.

The composition of the invention optionally can further comprise at least one co-solvent (F). Preferred are co-solvents that are high boiling solvents, that are capable of reducing the process viscosity and of increasing the colloidal stability of the final emulsion, for instance by modifying the HLB request of the organic phase. Particularly preferred are co-solvents having a boiling point between 100° C. and 300° C., preferably between 150° C. and 250° C., most preferably between 175° C. and 225° C., at 760 mm Hg.

Particularly preferred are co-solvents (F) that are selected from oxygenated solvents. Suitable examples include but are not limited to: (i) the fully and partially reacted alkyl or aryl esters of aromatic, aliphatic or cycloaliphatic polycarboxylic acids; (ii) the fully and partially reacted alkyl or aryl esters of aromatic, aliphatic or cycloaliphatic polyglycols; (iii) the fully and partially reacted alkyl or aryl ethers of aromatic, aliphatic or cycloaliphatic polyglycols, (iv) the neat, the alkyl and aryl substituted cyclic carbonates; (v) the neat, the alkyl and aryl substituted cyclic ethers; (vi) the neat, the alkyl and aryl substituted cyclic esters.

By "neat" is meant to designate that the compound is not substituted. Most typical compounds (F) are those selected from (i) the fully and partially reacted alkyl or aryl esters of aromatic, aliphatic or cycloaliphatic polyglycols; (ii) the fully and partially reacted alkyl or aryl ethers of aromatic, aliphatic or cycloaliphatic polyglycols.

Co-solvents that are suitable for use in the present invention include but are not limited to the diethyleneglycol monomethyl ether (DOWANOL®DM), dipropyleneglycol monomethyl ether (DOWANOL®DPM), dimethyl esters or di-isobutyl esters of adipic, glutaric, succinic or phthalic acids and their blends, the ethyl-3-ethoxypropionate (Ektapro®EEP, Eastman), the 2,2,4-trimethyl-1,3-pentanedioldiisobutirate (Kodaflex®TXBI, Eastman), ethylene carbonate and propylene carbonate, propyleneglycol diacetate (DOWANOL®PGDA), dipropylene glycol dimethyl ether (PROGLYDE®DMM), ethyl lactate. Preferably however, no coalescent solvents are present in compositions of the invention.

Where present, co-solvents (F) typically are present in an amount from 1 to 20 wt %, preferably from 2 to 10 wt %, more preferably from 3 to 6 wt % relative to the total weight of solids in the composition.

Compositions of the invention optionally may further comprise at least one neutralizing agent (G) that is capable to react e.g. with residual acids, present for instance as residual catalysts used for the esterification. Compounds (G) typically are selected from organic and/or inorganic bases. Suitable neutralizing agents (G) include organic tertiary amines such as trimethylamine, triethylamine, triisopropylamine, tributylamine, N,N-dimethylcyclohexylamine, N,N-dimethylaniline, N-methylmorpholine, N-ethylmorpholine, N-methylpiperazine, N-methylpyrrolidine and N-methylpiperidine, dibutylamino ethanol, N-butyl ethanolamine, N-butyl diethanolamine, 2-[1-(methylpropyl) aminoethanol, 2-amino-2-methyl-1-propanol, 2-dimethylamino-2-methyl-1-propanol and inorganic bases comprising monovalent metal cations, preferably alkali metals such as lithium, sodium potassium or calcium and anions such as hydroxides or carbonates. The total amount of these neutralizing agents can be determined experimentally to raise the pH of the emulsion to neutrality or alkalinity and depends on the presence of residual acids eventually present as catalysts during the esterification process leading to e.g. polyester (meth)acrylates or epoxy (meth)acrylates.

Compositions of the invention optionally may further comprise at least one photo-initiator (H), which typically is present in an amount from 0.1 to 10 wt %, preferably from 1 to 7 wt %, most preferably from 3 to 5 wt %, relative to the total weight of solids present in the composition. An example of photo-initiator suitable for this invention is Esacure®HB.

Where desired, compositions of the invention optionally may further comprise at least one functional molecule, oligomer or polymer (J) in an amount from 0.01 to 25 wt %, relative to the total weight of solids present in the composition. When present, typically they are present in an amount from 1 to 10 wt %, most preferably from 2.5 to 5 wt %. Compounds (J) are capable to modify the properties of the polymer composition, in liquid or solid form, in uncured or cured form and in such a way that it brings an additional performance value to the composition. Examples include siliconated and/or fluorinated ethylenically unsaturated compounds such as the products commercialized under the names of IRR 154 and ADDITOL®HGX83 are particularly suitable. Halogenated molecules, and in particular a fluorinated molecules, are capable to provide significant surface or interface effect like the adhesion and/or the surface tension. Also suitable are non ethylenically unsaturated siliconated compounds such as Silclean®3700.

It can be advantageous to have at least 2 different types of compounds (A) present in a composition of the invention. In a most simple way this can be done by blending two (or more) different compositions of the invention. Alternatively, this can be done by first blending the different compounds (A) followed by a step of emulsification using at least one emulsifier (B) according to the invention as described above.

It is possible as well to have at least one ethylenically unsaturated compound (K) that is different from compounds (A) present in the composition of the invention. This can be achieved by blending compositions of the invention with one or more other (radiation curable) aqueous compositions, which can be other emulsions but which can also be (other)

dispersions. This can however also be achieved by first blending compounds (A) with one or more compounds (K), followed by a step of emulsification using at least one emulsifier (B) according to the invention as described above.

The compound (K) can be a water-insoluble compound but it can also be a self-dispersing, self-emulsifiable or water-dilutate compound.

An advantage of the above approaches is that by using different molecules it is possible to modify or fine-tune the final properties of the coating composition in accordance with the envisaged end application. A particular advantage of these blends lies in their possibility to boost the hardness as well as the mechanical & chemical resistance of the cured coating made therefrom or, alternatively, to increase the flexibility of the cured coating made therefrom. Below a few practical examples:

Compositions (typically emulsions) of the invention can be blended with a polyurethane dispersion such as for instance UCECOAT® 7849, UCECOAT® 7177, UCE-COAT® 7710, UCECOAT® 7571, UCECOAT® 7689, UCECOAT® 7655 and UCECOAT® 7699. Other polymer dispersions can also be used even if they do not comprise reactive acrylate functions; products falling in this category include polyurethane dispersions (for instance under the name DAOTAN®), acrylic dispersions (for instance under the name VIACRYL®), polyester & alkyd dispersions (for instance under the name RESYDROL®) and polyepoxy dispersions (for instance under the name BECKOPDX®).

Hard-coat compositions that are based on highly functionalized low molecular weight compounds (A) can benefit from mixing with one or more flexible compounds (K) to improve impact resistance. Examples of such suitable compounds (K) are for instance flexibilizing urethane (meth) acrylates such as EBECRYL® 8465, EBECRYL® 8402, EBECRYL® 230, EBECRYL® 270 and/or EBECRYL® 244.

In a similar way, the chemical resistance or hardness provided by a coating composition according to the invention, can be improved by adding one or more compounds (K) with a high level of ethylenically unsaturated groups for a low molecular weight.

Compositions of the invention optionally may further comprise one or more external thermal crosslinkers that allow dual cure. Examples of suitable crosslinkers are (blocked) polyisocyanates, polyaziridines, polycarbodiimides, polyepoxides, polyalkoxysilanes and metal salts like zirconium ammonium carbonate.

Particularly suitable are polyisocyanates, in particular hydrophilic polyisocyanates like BAYHYDUR 3100.

Compositions of the invention can further include additional ingredients such as catalysts, inhibitors, antioxidants, biocides, fillers, nanoparticles, dyestuffs, pigments inert or functional resins and additives suitable to improve the application of the formulated dispersion on a substrate and including not imitatively rheology modifiers, anti-settling agents, wetting agents, leveling agents, anti-cratering agents, defoaming agents, slip agents, fire retardant agents, ultraviolet-protection agents, adhesion promoters, etc. Examples of suitable inhibitors include but are not limited to hydroquinone (HQ), methyl hydroquinone (THQ), tert-butyl hydroquinone (TBHQ), di-tert-butyl hydroquinone (DTBHQ), hydroquinone monomethyl ether (MEHQ), 2,6-di-tert-butyl-4-methylphenol (BHT) and the like. They may also include phosphines, like triphenylphosphine (TPP) and tris-nonylphenylphosphite (TNPP), phenothiazine (PTZ), triphenyl antimony (TPS) and any mixtures thereof.

Typically the composition of the invention is an aqueous emulsion, more typically an oil-in-water emulsion.

Compositions of the invention typically comprise from 25 to 95 wt % of water, more typically 35 to 50 wt % of water.

Compositions of the invention typically comprise less than 25 wt % of organic solvents (not including water). Typically they comprise less than 10 wt %, more typically less than 5 wt %, of organic solvents and volatile organic compounds (VOCs). Preferably compositions of the invention are free from organic solvents (not including water) and VOC's.

Compositions of the present invention are advantageous in that they are able to provide emulsions with low volatile organic content (VOC) and a very high solids content in combination with e.g. a low viscosity, a low droplet size, an excellent colloidal stability and a low film formation temperature (wet coating before cure).

Compositions of the invention can be used in combination with colorants, pigments and fillers.

Compositions of the invention typically are characterized by one or more of the following:
  a total solids content (or a solid solids content) from 5 to 75 wt %, more in particular from 20 to 75 wt %, more in particular from 30 to 75 wt %. In general the solid solids content is at least 50 wt %, more typically at least 60 wt %. Typically the solid solids content is at most 70 wt %, more typically at most 67 wt %, even more typically at most 65 wt %. It is rather unusual that stable radiation curable aqueous compositions with such high solid solids content can be obtained.
  a viscosity measured at 25° C. of from 20 to 2,000 mPa·s. Typically the viscosity is at least 300 mPa·s and typically at most 700 mPa·s at 25° C.
  a pH value of from 2 to 10, preferably of from 4 to 8.
  an average droplet size of between 100 and 1,000 nm, preferably between 300 and 700 nm.
  a minimum film formation temperature of from 0 to 40° C., more preferably from 0 to 10° C. and most preferably below 0° C.
  Compositions of the present invention typically provide wet or tacky coatings before active energy ray curing, typically radiation curing.
Preferably they combine all of the above characteristics.

An advantage of the compositions of the invention and of the use of emulsifiers (B) of the invention, is that they allow to obtain coatings with a very wide gloss level at an angle of 60° ranging from below 5% to above 95%, when appropriately formulated with the required additives and measured with a dedicated equipment following protocols described in the art. This very wide coverage is quite unique for waterborne polymers in general, that have more easy access to low gloss levels rather than high gloss levels. Low gloss coatings are usually obtained with the addition of a matting agent which is for instance a silica dispersion in water with the appropriate particle size distribution (for instance the ACEMATT®TS100).

An aspect of the invention relates to coating compositions that comprise or are prepared from compositions of the invention. In an embodiment of the invention the coating composition is a hard coat composition. A particular embodiment of the invention relates to hardcoats that can be obtained from a composition of the invention.

Compositions of the invention in particular permit to obtain hardcoats which show after radiation curing a superior chemical resistance against water, solvents or stains, and a superior mechanical resistance against scratch and abrasion. These coatings also exhibit a good adhesion on porous and non-porous substrates such as, for example, coatings for wood, plastic, glass, metal and concrete. The coatings obtained typically are colorless and transparent and have a high gloss.

Hardcoats for plastics are particularly envisaged in the frame of the invention. The product applications in this industry segment are endless and they can be typically associated to consumer electronics (like mobile phone, computer, television, compact disk), to automotive plastics for interior application (like dashboard, trim) or exterior application (like headlight, mirror, bumper, wheel cover) and to industrial plastics (like film, label, box, toy, sport equipment, garden furniture). An advantage of compositions of the invention is that they allow to produce hardcoat compositions that can be applied via spray applications.

Hardcoats of the invention after curing typically have a Persoz hardness as measured by appropriate pendulum equipment of at least 300 sec, preferably at least 320 sec, more preferably at least 340 sec, and most preferably at least 360 sec.

The compositions according to the invention are also suitable for use in overprint varnishes, inks and adhesives. An aspect of the invention relates to the use of compositions of the invention for the making of coatings (including overprint varnishes), adhesives and inks (both for contact and non-contact printing methods like inkjet). Another aspect concerns the making of these coatings, overprint varnishes, adhesives and inks from a composition of the invention. In particular, the composition of the invention can contain additional pigments. Yet another aspect of the invention relates to inks, adhesives or overprint varnishes comprising a composition of the invention, or prepared from a composition of the invention.

Yet another aspect of the invention relates to a process of coating or treating an article or a substrate, said method comprising the step of applying a composition of the invention to at least one surface of the article or the substrate, followed by a step of curing using e.g. active energy rays. Typically the curing step is preceded by a step of evaporating water. Typically at least 98% of the water, preferably at least 99%, preferably all of the water is evaporated. The active energy rays used for curing preferably are ultraviolet rays, electron beam, X-rays, radioactive rays or high frequency waves. Ultraviolet rays having a wavelength of from 180 to 400 nm are particularly preferred from economical viewpoint. Curing by irradiation may be followed by thermal curing in the presence of suitable external cross linkers.

In a particular embodiment of the invention the article or substrate comprises plastic, more in particular is made from plastic.

Compositions of the invention typically are cured by ultraviolet irradiation, generally in the presence of photoinitiator; they can also be cured by electron-beam irradiation, allowing the use of compositions free of photo-initiator. The compositions according to the invention are providing extremely rapid curing characterized by a higher reactivity allowing higher line speed or less irradiative energy curing and increased productivity. Low energy ultraviolet light sources can also be used (LED lamps).

In an embodiment of the invention radiation curing, at least in part, takes place in situ, in the aqueous emulsion. For instance an UV light can be brought into the composition of the invention to initiate a photoinduced polymerization to transform an emulsion into a hard crosslinked dispersion of colloidal polymerized particles (CPP) in the aqueous phase. By photoinduced polymerization is meant a polymerization initiated by the production of active species able to initiate a polymerization by exposure to actinic radiation such as visible light, ultraviolet radiations, gamma-rays, X-rays. Typically polymerization in the aqueous emulsion is induced by exposure to light with a wavelength ranging from 172 nm to 450 nm. This radiation can be emitted by any type of light source including carbon arc lights, low, medium and high pressure mercury vapor lamps, plasma arc lamps, xenon flash lamps, light emitting diodes, ultraviolet light emitting lasers and excimer lamps as further described in detail in "UV Coatings: Basics, Recent Developments and New Applications", Reinhold Schwalm; Elsevier (2007), p 45-48, or "Radiation Curing: Coatings and Printings Inks", Patrick Glöckner; Vincentz Network (2008), p 118-120.

This transformation can be facilitated by the use of a photoinitiator that is added to the emulsion or mixed with compounds (A) prior to the emulsification in water in the presence of the emulsifier(s) (B). In a particular embodiment of the invention, an additional compound (L) can be incorporated by adding it to compounds (A) prior to the emulsification in water in the presence of the emulsifier (B) in order to encapsulate it into the cured polymer particles and provide controlled release properties of compound (L) either within a waterborne dispersion or in the (cured) coating obtained after water evaporation and film formation.

Yet another aspect of the invention relates to an article or substrate coated or treated via a process according to the invention.

The composition of the invention can also be used to blend with any other water-borne polymer dispersion, radiation-curable or not, in order to modify the final coating properties after cure. The waterborne polymer dispersion can be for instance an acrylic latex, a polyurethane dispersion, a polyester dispersion or any radiation-curable variant of these.

Throughout the invention and in the Examples Section the following measuring methods have been used to characterize the compounds and compositions of the invention as well as coatings obtained herewith:

Emulsion characterization: The solid content was measured by using a gravimetric method with a drying of 2 h at 105° C. The viscosity of the dispersion was measured at 25° C. with a Brookfield viscometer using spindle No 1 at 50 rpm. The average droplet size of the aqueous polymer dispersion was measured by laser light scattering using a Malvern Autosizer Particle Analyzer. The minimum film formation temperature (MFFT) of the dispersion was measured on an automatic gradient-heated metal plate according to the standard method ISO 2115: 1996.

Colloidal stability: The colloidal stability was assessed by observing the phase separation (expressed in percent of the total height) by using multiple light scattering (Turbiscan® by Formulation) on a 50 g sample during 1 day at RT and 10 days at 60° C.; it is important to realize that for an emulsion with a solid content of 65%, the worse colloidal stability corresponding to the maximum of phase separation is reached at a value of 35% of upper water layer.

Molecular weight: The molecular weight of the acrylated oligomers is either calculated based on a target molecule representing the biggest fraction of the composition or measured by gel permeation chromatography (GPC) in case of higher molecular weight molecules. Therefore, a small portion of the oligomer is dissolved in tetrahydrofuran (THF) and injected in the liquid chromatograph after a preliminary filtration. The components of the sample are typically eluted by the mobile phase solvent (THF) at a flow rate of 1 ml/min and separated by a combination of polystyrene-divinylbenzene columns at a temperature of 40° C.

Standards of polystyrene with known molecular weight and narrow polydispersity are used to generate a calibration curve.

HLB value: The HLB value (stands for Hydrophobic-Lipophilic Balance) of the emulsifier is defined as the percent of polyethylene oxide in the molecule, divided by 5. By definition, HLB values are restricted between the excluded values of 0 and 20. HLB values were determined according to the method presented infra.

Transparency: the transparency of the coating is assessed on a hard PC sheet. The results are rated visually and recorded in a 1-5 scale: 5=fully transparent; 4=very slightly hazy; 3=slightly hazy; 2=hazy; 1=opaque. A high value (5) is expected to provide the best appearance and functionality of the coated object.

Adhesion (cross hatch tape): The adhesion (ADH) is assessed using a cross hatch test. 5 cuts of ~1 cm long and spaced by ~1 mm are made in the coating using a knife, followed by 5 similar cuts in the transversal direction. The adhesion was measured using an adhesive tape (Scotch®) firmly pressed on the cross-cut coating and removed rapidly; the damage to the cross-cut surface area of the coating due to adhesion loss is expressed in a 0-5 scale, 5=best. A high adhesion is necessary to ensure a strong permanent bond between the coating and the substrate.

Stain resistance (Artline®70N black marker on PC): a stain is made with the black alcohol marker (Artline®70N) and washed after 5 minutes at ambient temperature using a tissue saturated with isopropanol. The results are rated visually and recorded in a 1-5 scale: 5=no stain; 4=very light stain; 3=moderate stain; 2=strong stain; 1=very strong stain. A high value (5) is expected to provide the best protection against any degradation of the coated object.

Solvent resistance (acetone double rubs on PC): the solvent resistance is assessed with acetone double rubs (ADR) by pressing a cotton rag saturated with acetone with a backward and forward motion on the coated surface; one double rub is equal to a backward and forward stroke on the coated surface. The reported number is the number of double rubs required to break through the coating. A high solvent resistance (more than hundred acetone double rubs) is necessary to ensure a good protection of the coating and the substrate against any household or industrial product spillage.

Water resistance I: the coated plastic is placed in water at room temperature during 24 hours. Afterwards, the aspect of the coating is checked and a cross hatch tape adhesion is performed right after immersion as well as 1 h after immersion. The damage to the cross-cut surface area of the coating due to adhesion loss is expressed in a 0-5 scale, 5=best.

Water resistance II: the coated plastic is placed in water during 2 hours at 80° C. Afterwards, the aspect of the coating is checked and a cross hatch tape adhesion is performed right after immersion as well as 1 h after immersion. The damage to the cross-cut surface area of the coating due to adhesion loss is expressed in a 0-5 scale, 5=best.

Water resistance III: the coated plastic is exposed to accelerated weathering according to VW "TL 226" test protocol corresponding to 72 hours exposure at 90° C. and 95% relative humidity. Afterwards, the aspect of the coating is checked and a cross hatch tape adhesion is performed right after immersion as well as 1 h after immersion. The damage to the cross-cut surface area of the coating due to adhesion loss is expressed in a 0-5 scale, 5=best.

Scratch resistance (steel wool on PC): the test is performed by scratching the coating with the steel wool for 10 double rubs. The results are rated visually and recorded in a 1-5 scale: 5=no scratch; 4=very light scratch; 3=moderate scratch; 2=strong scratch; 1=very strong scratch. A high value (5) is expected to provide the best protection against any deterioration of the coated object.

The invention is now further described in more details in the following Examples, which in no way intend to limit the invention or its applications.

Example 1

A 65% solids emulsion is prepared from a Cytec proprietary urethane acrylate diluted in a polyester acrylate (unsaturation level ca. 8 meq/g) (compound A), a nonionic di-bloc emulsifier (compound B) and a co-solvent (compound F). Maxemul®7101 (Croda) is a proprietary di-bloc copolymer essentially consisting of a polyethylene oxide and a polypropylene oxide moiety, having an HLB~11.5. Dowanol®DPM (Dow Chemicals) is a co-solvent with the structure of dipropyleneglycol, nonomethylether.

Example 2

A 65% solids emulsion derived from Example 1 is prepared from a dipentaerythrytol hexaacrylate (DPHA) (compound A), a nonionic di-bloc emulsifier (compound B) and a co-solvent (compound F). DPHA (Cytec) is a polyester acrylate having a unsaturation level ca. 11.4 meq/g.

Examples 3-5

Emulsions at 65% solids derived from Example 1, with varying amounts of nonionic bloc emulsifier (Maxemul®7101) and co-solvent (Dowanol®DPM).

Examples 6-11

Emulsions at 65% solids derived from Example 1, with varying nature of nonionic bloc emulsifiers and a co-solvent (Dowanol®DPM); the Maxemul®7102 (Croda) is a proprietary di-bloc copolymer basically consisting of a polyethylene oxide and a polypropylene oxide moiety and having an HLB in the claimed range; the Pluronic®PE6200, Pluronic®PE6400 and Pluronic®PE6800 (BASF) are proprietary nonionic tri-bloc emulsifiers basically consisting of a polyethylene oxide, a polypropylene oxide and a polyethylene oxide moiety and having an HLB of respectively ~4, ~8 and ~16. An HLB of ~4 falls outside the scope of the invention (Example 7R). Example 11R concerns a proprietary non-ionic tri-bloc emulsifier basically consisting of a polypropylene oxide, a polyethylene oxide and a polypropylene oxide moiety and having a lower HLB value.

Example 12

A 65% solids emulsion based on Example 1, with the exception that an acrylated version of the emulsifier is used—See Example 1P for the making on an acrylated version of Maxemul®7101, having a I[OH] of 20 mgKOH/g (0.36 meq/g).

Example 13

A 65% solids emulsion based on Example 1, with the exception that another co-solvent is used. EBECRYL®11 is a proprietary acrylated co-solvent consisting of polyethyleneglycol (600) diacrylate from Cytec.

Examples 14-15

Emulsions at 65% solids based on Example 1, with varying nature of neutralizing agent. Advantex® (Taminco) is a proprietary amine consisting of N-butyl ethanolamine; alternatively, sodium hydroxide (NaOH) was selected as an inorganic alkali to neutralize the emulsion.

Comparative Examples 16R-19R

Emulsions at 65% solids based on Example 1, with varying nature of anionic or nonionic emulsifiers falling outside the scope of the invention; Maxemul®7201 (Croda) is a proprietary anionic emulsifier; the Aerosol®A102 (Cytec) is an anionic emulsifier based on an alkyl sulfosuccinate structure; the Dowfax®2A1 (Dow Chemicals) is a proprietary anionic emulsifier consisting of an alkyldiphenyloxide disulfonate salt; Tergitol 15S40 (Dow Chemicals) is a proprietary nonionic emulsifier consisting of a secondary alcohol ethoxylate (41 moles) having an HLB~18.

Examples 20-21

Emulsions at 65% solids based on Example 1, with varying nature of additives incorporated during the emulsification process; IRR®668 (Cytec) is a proprietary fluorinated urethane:acrylate capable to provide desirable surface effects comprising water repellency, easy cleaning and anti-fingerprint properties associated with improved weatherability. Esacure®HB (Lamberti) is a photoinitiator having a benzophenone-type composition capable to cure the coating under the action of ultraviolet light.

Example 22

Emulsion at 65% solids of an unsaturated polyurethane oligomer, a nonionic bloc emulsifier (Maxemul®7101) and a co-solvent (Dowanol®DPM).

Example 23

Blend obtained by mixing Ucecoat®7849 (Cytec), a proprietary radiation curable polyurethane dispersion, with the emulsion of Example 1.

Example 24R

The urethane acrylate of Example 1 in its pure (100%) form, serving as a reference for hardcoat compositions, further diluted with organic solvents in order to decrease the product viscosity to a level requested for application.

Emulsification Using a Phase Inversion Process (without Neutralization)

Example 1

A double-wall stainless steel vessel connected with a heated bath at 60° C. is charged with 55.9 g of the compounds (A) of example 1 (86 parts), 5.2 g of MAX-EMUL®7101 (8 parts) and 3.9 g of DOWANOL®DPM (6 parts). The blend is stirred at a rotation speed of 100 rpm with a cowless propeller having a diameter of 60 mm until the temperature reaches 60° C. The mixture is then stirred at a rotation speed of 2000 rpm while 16.25 g of water at room temperature is added at a constant flow rate during about 5 minutes using a peristaltic pump to reach a solid content of ca. 80%. A phase inversion point corresponding to a maximum of the viscosity is observed and the mixture is further sheared at a rotation speed of 2000 rpm for an additional period of 20 min at a constant temperature of 60° C. An additional quantity of 18.75 g of water at room temperature is then added to the mixture at a constant flow rate during about 5 minutes using a peristaltic pump, while the cowless rotation speed is progressively decreased to 200 rpm and the temperature decreased to room temperature. The final emulsion has a solid content of ca. 65%.

Emulsification Using a Phase Inversion Process (without Neutralization)

Example 2

A double-wall stainless steel vessel connected with a heated bath at 60° C. is charged with 55.9 g of dipentaerythrytol hexaacrylate (DPHA) (86 parts), 5.2 g of MAX-EMUL®7101 (8 parts) and 3.9 g of DOWANOL®DPM (6 parts). The blend is stirred at a rotation speed of 100 rpm with a cowless propeller having a diameter of 60 mm until the temperature reaches 60° C. The mixture is then stirred at a rotation speed of 2000 rpm while 16.25 g of water at room temperature is added at a constant flow rate during about 5 minutes using a peristaltic pump to reach a solid content of ca. 80%. A phase inversion point corresponding to a maximum of the viscosity is observed and the mixture is further sheared at a rotation speed of 2000 rpm for an additional period of 20 min at a constant temperature of 60° C. An additional quantity of 18.75 g of water at room temperature is then added to the mixture at a constant flow rate during about 5 minutes using a peristaltic pump, while the cowless rotation speed is progressively decreased to 200 rpm and the temperature decreased to room temperature. The final emulsion has a solid content of ca. 65%.

Emulsification Using a Phase Inversion Process (with Neutralization)

Example 14

A double-wall stainless steel vessel connected with a heated bath at 60° C. is charged with 55.9 g of the compounds (A) of example 1 (86 parts), 5.2 g of MAX-EMUL®7101 (8 parts) and 3.9 g of DOWANOL®DPM (6 parts). The blend is stirred at a rotation speed of 100 rpm with a cowless propeller having a diameter of 60 mm until the temperature reaches 60° C. The mixture is then stirred at a rotation speed of 2000 rpm while 16.25 g of water at room temperature is added at a constant flow rate during about 5 minutes using a peristaltic pump to reach a solid content of ca. 80%. A phase inversion point corresponding to a maximum of the viscosity is observed and the mixture is further sheared at a rotation speed of 2000 rpm for an additional period of 20 min at a constant temperature of 60° C. An additional quantity of 18.75 g of water and 0.75 g of Advantex® at room temperature is then added to the mixture at a constant flow rate during about 5 minutes using a peristaltic pump, while the cowless rotation speed is progressively decreased to 200 rpm and the temperature decreased to room temperature. The final emulsion has a solid content of ca. 65%.

Emulsification Using a Phase Inversion Process (with Additive)

Example 20

A double-wall stainless steel vessel connected with a heated bath at 60° C. is charged with 51.9 g of proprietary urethane acrylate of Example 1 (86 parts), 5.2 g of MAX-EMUL®7101 (8 parts) and 3.9 g of DOWANOL®DPM (6 parts). The blend is stirred at a rotation speed of 100 rpm with a cowless propeller having a diameter of 60 mm until the temperature reaches 60° C. An additional quantity of 4 g of IRR®768 is added until homogenous. The mixture is then stirred at a rotation speed of 2000 rpm while 16.25 g of water at room temperature is added at a constant flow rate during about 5 minutes using a peristaltic pump to reach a solid content of ca. 80%. A phase inversion point corresponding to a maximum of the viscosity is observed and the mixture is further sheared at a rotation speed of 2000 rpm for an additional period of 20 min at a constant temperature of 60° C. An additional quantity of 18.75 g of water at room temperature is then added to the mixture at a constant flow rate during about 5 minutes using a peristaltic pump, while the cowless rotation speed is progressively decreased to 200 rpm and the temperature decreased to room temperature. The final emulsion has a solid content of ca. 65%.

Preparation of a Blend with a Water-Dispersible Polyurethane

Example 23

A vessel is charged with 100 g of Ucecoat®7849 and mixed at ambient temperature using a mechanical agitator at a speed of 100 rpm. 30 g of the emulsion of Example 1 is slowly added to the vessel during a period of about 5 minutes. The final water-based product has a solid content of about 45%.

Example 1P

Preparation of the Acrylated Emulsifier Used in Example 12

A double wall glass reactor connected with an oil heating bath and fitted with an agitator, a condenser, a Dean-Stark and an air diffuser is charged with 300 g of Maxemul®7101 previously molten at 60° C. (IOH 18-22 mg KOH/g), 0.67 g of hydroquinone monomethylether, 0.5 g of p-tertiobutyl-catechol, 0.4 g of hypophosphoric acid at 50%, 0.6 g of phosphoric acid, 1.53 g of p-toluenesulfonic acid at 65%, 31.57 g of toluene and 15.7 g of acrylic acid while agitating at a speed of 100 rpm. It is heated up to the temperature of 60° C. with a constant air flow of 2 liters/hour. Consecutively, the reaction medium is heated to a maximum of 128° C. (with a jacket temperature at 150° C.). The acid value is measured after 6 hours of reaction to control the esterification of the acrylic acid. A plateau-value is reached typically after 12 to 15 hours, corresponding to 2.31 g of water at the bottom of the Dean-Stark. The temperature is then cooled down to 105° C. and an additional 0.67 g of MeHQ is added. The stripping is started by going progressively to full vacuum during 6 hours at a temperature between 100° C. and 105° C. When no solvent remains, the product is cooled down to a minimum temperature of 60° C. and drummed off the reactor.

Alternative process: A double wall glass reactor connected with an oil heating bath and fitted with an agitator, a condenser, a Dean-Stark and an air diffuser is charged with 250 g of Maxemul®7101 (IOH=20 mg KOH/g) previously molten at 60° C. and 0.1285 g of hydroquinone monomethylether while agitating at a speed of 100 rpm. It is cooled down to the temperature of 50° C. with a constant air flow of 1 liters/hour. 7.27 g of acryloyl chloride is consecutively added drop wise to control the exothermicity by using an addition funnel mounted with an air-dryer. The chlorhydric acid formed during the reaction is eliminated through the air flow and collected in a wash bottle containing water. 2 hours after last drop addition, a sample is taken to check the hydroxyl value (mgKOH/g) that should be below 1 mgKOH/g. If the expected value is not reached, the reaction is continued at 50° C. for another 30 minutes until the target hydroxyl value is reached. The product is then drummed of the reactor and cooled to room temperature.

Description of Formulation & Application

The examples 1-23 were formulated according to a water-based protocol (aqueous emulsions) while the example 24 was formulated according to a solvent-based protocol (dilution in solvents) as described in the table below.

TABLE 1

| Ingredient | Aqueous emulsions | Dilution in solvents |
|---|---|---|
| Examples 1-24 | 100 | — |
| Example 25R | — | 48 |
| Esacure ®HB | 2.8 | — |
| Esacure ®KS300 | — | 2 |
| TEGO ®Twin 4100 | 0.5 | — |
| MODAFLOW ® 9200 | — | 0.25 |
| Isopropyl alcohol | — | 50 |

The formulated products were applied on a plastic substrate using a Meyer bar in order to target a dry film thickness (DFT) of approx. 10 g/m$^2$. There was a forced drying of 2 min. at 80° C. (water-based protocol) or 5 min. at 50° C. (solvent-based protocol) followed by UV curing with 2 passes at 10 m/min using 120 W/cm Hg lamp. The coated panels were allowed for 24 h conditioning at room temperature before testing. The substrates considered were polycarbonate (PC), poly(ethyleneterephtalate) (PET), acrylonitrile butadiene styrene (ABS), polystyrene (PS), poly (vinylchloride) (PVC), poly(methylmethacrylate) (PMMA), polyethylene, corona-treated (PE*) and polypropylene, corona-treated (PP*). The plastic surfaces were cleaned with IPA prior to use.

The coated plastics were tested for aspect, transparency, adhesion, scratch resistance, solvent resistance and water resistance tests.

Composition of the water- and solvent-borne formulations is given in Tables 2-4 below. Test results are shown in Tables 5-7.

TABLE 2

| | EX 3 | EX 4 | EX 5 | EX 6 | EX 7R | EX 8 | EX 9 |
|---|---|---|---|---|---|---|---|
| Compounds (A) of Ex1 | 59.8 | 59.8 | 63.7 | 55.9 | 55.9 | 55.9 | 55.9 |
| Maxemul ®7101 | 5.2 | 1.3 | 1.3 | — | — | — | — |
| Maxemul ®7102 | — | — | — | 5.2 | — | — | — |
| Pluronic ®PE6200 | — | — | — | — | 5.2 | — | — |
| Pluronic ®PE6400 | — | — | — | — | — | 5.2 | — |
| Pluronic ®PE6800 | — | — | — | — | — | — | 5.2 |
| Dowanol ®DPM | 0 | 3.9 | 0 | 3.9 | 3.9 | 3.9 | 3.9 |
| Water I | 16.25 | 16.25 | 16.25 | 16.25 | 16.25 | 16.25 | 16.25 |
| Water II | 18.75 | 18.75 | 18.75 | 18.75 | 18.75 | 18.75 | 18.75 |

TABLE 3

|  | EX 10 | EX 11R | EX 12 | EX 13 | EX 14 | EX 15 |
|---|---|---|---|---|---|---|
| Compounds (A) of Ex1 | 59.8 | 55.9 | 55.9 | 55.9 | 55.9 | 55.9 |
| Maxemul ®7101 | — | — | — | 5.2 | 5.2 | 5.2 |
| Pluronic ®PE6200 | 2.6 | — | — | — | — | — |
| Pluronic ®PE6800 | 2.6 | — | — | — | — | — |
| Proprietary tri-bloc* | — | 5.2 | — | — | — | — |
| Emulsifier RC516 | — | — | 5.2 | — | — | — |
| Dowanol ®DPM | — | 3.9 | 3.9 | — | 3.9 | 3.9 |
| Ebecryl ®11 | — | — | — | 3.9 | — | — |
| Advantex ® | — | — | — | — | 0.75 | — |
| Sodium hydroxide | — | — | — | — | — | 0.25 |
| Water I | 16.25 | 16.25 | 16.25 | 16.25 | 16.25 | 16.25 |
| Water II | 18.75 | 18.75 | 18.75 | 18.75 | 18.00 | 18.50 |

*Of the type PO-EO-PO and with a too low HLB value

TABLE 4

|  | EX 16R | EX 17R | EX 18R | EX 19R | EX 20 | EX 21 |
|---|---|---|---|---|---|---|
| Compounds (A) of Ex1 | 55.9 | 55.9 | 55.9 | 55.9 | 45.9 | 51.9 |
| Maxemul ®7101 | — | — | — | — | 5.2 | 5.2 |
| Maxemul ®7201 | 5.2 | — | — | — | — | — |
| Aerosol ®A102 | — | 5.2 | — | — | — | — |
| Dowfax ®2A1 | — | — | 5.2 | — | — | — |
| Tergitol ®15S40 | — | — | — | 5.2 | — | — |
| Dowanol ®DPM | 3.9 | 3.9 | 3.9 | 3.9 | 3.9 | 3.9 |
| IRR ®768 | — | — | — | — | 10 | — |
| Esacure ®HB | — | — | — | — | — | 4 |
| Water I | 16.25 | 16.25 | 16.25 | 16.25 | 16.25 | 16.25 |
| Water II | 18.75 | 18.75 | 18.75 | 18.75 | 18.75 | 18.75 |

TABLE 5

| Example | Solid (%) | Viscosity (mPa·s) mPa·s | pH | Droplets (nm) nm | MFFT (°C.) °C. | Stability 1 d RT (%) % | Stability 10 d60° C. (%) % |
|---|---|---|---|---|---|---|---|
| F1 | 65 | 316 | 3.4 | 423 | 0 | 0 | 0 |
| F2 | 65 | 245 | 2.2 | 335 | 0 | 0 | 18 |
| F3 | 65 | 487 | 3.4 | 630 | 0 | 0 | 1 |
| F4 | 65 | 4480 | 2.7 | 1895 | 0 | 0 | 18 |
| F5 | 65 | 6550 | 2.6 | 1920 | 0 | 0 | 22 |
| F6 | 65 | 453 | 3.4 | 801 | 0 | 0 | 0 |
| F7R | 65 | N/A | N/A | N/A | 0 | 35 | 35 |
| F8 | 65 | 540 | 3.8 | 759 | 0 | 0 | 5 |
| F9 | 65 | 436 | 5.5 | 639 | 0 | 0 | 5 |
| F10 | 65 | 404 | 3.5 | 576 | 0 | 0 | 5 |
| F11R | 65 | N/A | N/A | N/A | 0 | 35 | 35 |
| F12 | 65 | 328 | 1.1 | 753 | 0 | 0 | 0 |
| F13 | 65 | 184 | 2.3 | 343 | 0 | 0 | 0 |
| F14 | 65 | 345 | 7.2 | 490 | 0 | 0 | 0 |
| F15 | 65 | 312 | 7.4 | 590 | 0 | 0 | 1 |
| F16R | 65 | N/A | N/A | N/A | 0 | 35 | 35 |
| F17R | 65 | N/A | N/A | N/A | 0 | 35 | 35 |
| F18R | 65 | N/A | N/A | N/A | 0 | 35 | 35 |
| F19R | 65 | 158 | 2.8 | 2085 | 0 | 4 | 35 |
| F20 | 65 | 383 | 3.2 | 400 | 0 | ? | 0 |
| F21 | 65 | 256 | 2.3 | 418 | 0 | 0 | (gel) |
| F22 | 65 |  |  |  |  |  |  |
| F23 | 45.5 | 86 | 7.0 | 269 | 0 | 0 | 0 |
| F24R | 100 | 2000 (60° C.) | — | — | — | N/A | N/A |

The emulsions which are not stable at room temperature have not been formulated, applied and tested on plastics for performance (N/A = not applicable).

TABLE 6

| | Adhesion (CHA) | | | | | | | |
|---|---|---|---|---|---|---|---|---|
| Example | PC | PS | PMMA | ABS | PVC | PET | PE* | PP* |
| F1 | 5 | 0 | 5 | 5 | 5 | 5 | 0 | 0 |
| F2 | 5 | 0 | 5 | 5 | 5 | 5 | 0 | 0 |
| F3 | 5 | 0 | 5 | 5 | 5 | 5 | 0 | 0 |
| F4 | 5 | 0 | 5 | 5 | 5 | 5 | 0 | 0 |
| F5 | 5 | 0 | 5 | 5 | 5 | 5 | 0 | 0 |
| F6 | 5 | 0 | 5 | 5 | 5 | 5 | 0 | 0 |
| F7R | N/A | N/A | N/A | N/A | N/A | N/A | N/A | N/A |
| F8 | 5 | 0 | 5 | 5 | 5 | 5 | 0 | 0 |
| F9 | 5 | 0 | 5 | 5 | 5 | 5 | 0 | 0 |
| F10 | 5 | 0 | 5 | 5 | 5 | 5 | 0 | 0 |
| F11R | N/A | N/A | N/A | N/A | N/A | N/A | N/A | N/A |
| F12 | 5 | 0 | 5 | 5 | 5 | 5 | 0 | 0 |
| F13 | 5 | 0 | 5 | 5 | 5 | 5 | 0 | 0 |
| F14 | 5 | 0 | 5 | 5 | 5 | 5 | 0 | 0 |
| F15 | 5 | 0 | 5 | 5 | 5 | 5 | 0 | 0 |
| F16R | N/A | N/A | N/A | N/A | N/A | N/A | N/A | N/A |
| F17R | N/A | N/A | N/A | N/A | N/A | N/A | N/A | N/A |
| F18R | N/A | N/A | N/A | N/A | N/A | N/A | N/A | N/A |
| F19R | 5 | 0 | 5 | 5 | 5 | 5 | 0 | 0 |
| F20 | 5 | 0 | 5 | 5 | 5 | 5 | 0 | 0 |
| F21 | 5 | 0 | 5 | 5 | 5 | 5 | 0 | 0 |
| F22 | 5 | 5 | 5 | 5 | 5 | 5 | 0 | 0 |
| F23 | 5 | 5 | 5 | 5 | 5 | 5 | 0 | 0 |
| F24R | 5 | 0 | 5 | 5 | 5 | 5 | 0 | 0 |

TABLE 7

| Example | Scratch | N70 | ADR | WR1 (ABS/PC) | WR2 (ABS/PC) | WR3 (ABS/PC) | TR |
|---|---|---|---|---|---|---|---|
| 1 | 5 | 5 | 100+ | 5/5 | 5/0 | 5/0 | 5 |
| 2 | 5 | 5 | 100+ | 5/5 | 4/0 | 4/0 | 5 |
| 3 | 5 | 5 | 100+ | 5/5 | 5/0 | 5/0 | 5 |
| 4 | 5 | 5 | 100+ | 5/5 | 5/0 | 5/0 | 5 |
| 5 | 5 | 5 | 100+ | 5/5 | 5/0 | 5/0 | 5 |
| 6 | 4 | 5 | 100+ | 5/5 | 4/0 | 4/0 | 5 |
| 7R | N/A | N/A | N/A | N/A | N/A | N/A | N/A |
| 8 | 4 | 5 | 100+ | 5/5 | 5/0 | 5/0 | 5 |
| 9 | 4 | 5 | 100+ | 5/5 | 5/0 | 5/0 | 5 |
| 10 | 4 | 5 | 100+ | 5/5 | 5/0 | 5/0 | 5 |
| 11R | N/A | N/A | N/A | N/A | N/A | N/A | N/A |
| 12 | 5 | 5 | 100+ | 5/5 | 5/3 | 5/0 | 5 |
| 13 | 5 | 5 | 100+ | 5/5 | 5/0 | 5/0 | 5 |
| 14 | 5 | 5 | 100+ | 5/5 | 5/0 | 5/0 | 5 |
| 15 | 5 | 5 | 100+ | 5/5 | 5/0 | 5/0 | 5 |
| 16R | N/A | N/A | N/A | N/A | N/A | N/A | N/A |
| 17R | N/A | N/A | N/A | N/A | N/A | N/A | N/A |
| 18R | N/A | N/A | N/A | N/A | N/A | N/A | N/A |
| 19R | 4 | 5 | 100+ | 5/5 | 4/0 | 4/0 | 5 |
| 20 | 5 | 5 | 100+ | 5/5 | 5/3 | 5/1 | 3 |
| 21 | 5 | 5 | 100+ | 5/5 | 5/0 | 5/0 | 5 |
| 22 | 3 | 5 | 100+ | 5/5 | 5/0 | 4/0 | 5 |
| 23 | 3 | 5 | 100+ | 5/5 | 4/0 | 3/0 | 5 |
| 24R | 5 | 5 | 100+ | 5/5 | 5/5 | 5/0 | 5 |

The invention claimed is:
1. An aqueous radiation curable composition comprising: (I) at least one ethylenically unsaturated compound (A), and (II) at least one emulsifier (B) that comprises alternating polyalkylene oxide segments,
wherein said compound (A) is a water-insoluble compound,
wherein said emulsifier (B) bears no ethylenically unsaturated groups, and optionally bears one or more groups selected from at least one of alkyl groups, aryl groups and hydroxyl groups,
wherein said emulsifier (B) has an HLB value of at least 5 and at most 19, and wherein said emulsifier (B) is represented by the general formula (I):

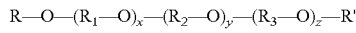

R—O—(R$_1$—O)$_x$—(R$_2$—O)$_y$—(R$_3$—O)$_z$—R' wherein
each of R1, R2 or R3 independently is a linear or branched C2-C12 alkyl;
R1≠R2 and R3≠R2;
X=6-100;
Y=6-100;
Z=0-100; and
R and R' each independently is selected from the following: linear or branched C1-C18 alkyl, linear or branched C6-C24 aryl or —H.

2. A coating composition, ink, overprint varnish or adhesive comprising at least one composition according to claim 1.

3. A process of coating an article or a substrate, comprising the steps of applying a composition according to claim 2 to at least one surface of the article or the substrate, followed by a step of curing the composition, which curing step optionally is preceded by a step of evaporating water.

4. The composition of claim 1, wherein, in said formula (I), R and R' each independently is selected from the following: linear or branched C1-C18 alkyl or —H.

5. The composition of claim 1, wherein said compound (A) is selected from the group consisting of one or more of urethane (meth)acrylates, polyester (meth)acrylates, polyepoxy (meth)acrylates, polycarbonate (meth)acrylates, polyether (meth)acrylates, and polyacrylic (meth)acrylates.

6. The composition of claim 1, wherein said compound (A) does not comprise any pendant hydrophilic groups nor any alkylene oxide segments in an amount that would render the compound self-dispersible, self-emulsifiable or water-soluble.

7. The composition of claim 1, which is an emulsion.

8. The composition of claim 1, wherein said emulsifier (B) consists essentially of alternating polyethylene oxide segments and polypropylene oxide segments, and wherein said emulsifier (B) has an HLB value of at least 6 and at most 19.

9. The composition of claim 1, wherein said compound (A) is characterized by an amount of ethylenically unsaturated groups of at least 4 meq/g, and optionally by a functionality of at least 3 ethylenically unsaturated groups per molecule.

10. The composition of claim 1, wherein said compound (A) is at least one of urethane (meth)acrylate(s) and polyester (meth)acrylate(s).

11. The composition of claim 10, wherein the urethane (meth)acrylate(s) have a molecular weight of between 400 and 20,000 Daltons and the polyester (meth)acrylate(s) have a molecular weight of between 200 and 20,000 Daltons.

12. The composition of claim 1, wherein said emulsifier (B) is at least one of di-bloc polyalkylene oxide and tri-bloc polyalkylene oxide copolymers.

13. The composition of claim 12, wherein said emulsifier (B) is di-bloc copolymers comprised of alternating sequences of (i) polyethylene oxide with a degree of polymerization comprised between 6 and 100 units, and (ii) polypropylene oxide with a degree of polymerization comprised between 6 and 100 units.

14. The composition of claim 12, wherein said emulsifier (B) is tri-bloc copolymers comprised of alternating sequences of (i) polyethylene oxide with a degree of polymerization comprised between 6 and 100 units, (ii) polypropylene oxide with a degree of polymerization comprised between 6 and 100 units, and (iii) polyethylene oxide with a degree of polymerization comprised between 6 and 100 units.

15. The composition of claim 1, wherein said emulsifier (B) bears at least one terminal alkyl group.

16. The composition of claim 1, wherein said emulsifier (B) has an HLB value from 10 to 17.

17. The composition of claim 1, wherein said HLB value is the weighted average of HLB values of a blend of emulsifiers.

18. The composition of claim 1, comprising, relative to the total weight of said compound (A) and said emulsifier (B), from 50 to 99.9 wt% of said compound (A) and from 0.1 to 50 wt% of said emulsifier (B).

19. The composition of claim 1, further comprising at least one of at least one co-solvent having a boiling point between 100° C. and 300° C. at 760 mm Hg and at least one neutralizing agent selected from at least one of organic bases and inorganic bases.

20. The composition of claim 1, wherein the composition has a solids content of from 5 to 75 wt%.

* * * * *